United States Patent
Shirakawa et al.

(10) Patent No.: US 6,450,803 B2
(45) Date of Patent: Sep. 17, 2002

(54) HEAT TREATMENT APPARATUS

(75) Inventors: Eiichi Shirakawa, Kumamoto (JP); Nobuyuki Sata, Kumamoto (JP)

(73) Assignee: Tokyo Electron Limited, Tokyo (JP)

(*) Notice: Subject to any disclaimer, the term of this patent is extended or adjusted under 35 U.S.C. 154(b) by 0 days.

(21) Appl. No.: 09/781,418

(22) Filed: Feb. 13, 2001

Related U.S. Application Data

(62) Division of application No. 09/226,606, filed on Jan. 7, 1999, now Pat. No. 6,222,161, which is a division of application No. 09/260,031, filed on Mar. 2, 1999.

(30) Foreign Application Priority Data

| Jan. 12, 1998 | (JP) | 10-4222 |
| Jan. 19, 1998 | (JP) | 10-7920 |
| Jan. 19, 1998 | (JP) | 10-7921 |

(51) Int. Cl.$^7$ ............................. F27D 15/02
(52) U.S. Cl. ............ 432/77; 432/233; 118/715
(58) Field of Search ............ 432/77, 173, 233; 118/724, 725, 715; 392/416, 418; 209/405, 411

(56) References Cited

U.S. PATENT DOCUMENTS

| 5,451,260 A | * | 9/1995 | Versteeg et al. ............ 118/725 |
| 5,998,766 A | * | 12/1999 | Mizosaki et al. ............ 219/390 |
| 6,059,922 A | * | 5/2000 | Yamzaki et al. ............ 118/723 |

FOREIGN PATENT DOCUMENTS

| JP | 55-020213 | 2/1980 |
| JP | 58-134431 | 8/1983 |
| JP | 61-080818 | 4/1986 |
| JP | 61-089632 | 5/1986 |
| JP | 03-069111 | 3/1991 |
| JP | 03-165483 | 7/1991 |
| JP | 03-169367 | 7/1991 |
| JP | 04-096317 | 3/1992 |
| JP | 04-098784 | 3/1992 |
| JP | UM04-26525 | 4/1992 |
| JP | 04-158512 | 6/1992 |
| JP | 05-251333 | 9/1993 |
| JP | 05-304085 | 11/1993 |
| JP | 06-037006 | 2/1994 |
| JP | 07-502381 | 7/1995 |
| JP | 07-254545 | 10/1995 |
| JP | 07-281453 | 10/1995 |
| JP | 08-107057 | 4/1996 |
| JP | 09-162176 | 6/1997 |
| JP | 07-111232 | 4/1999 |
| WO | 94/01597 | 1/1994 |

* cited by examiner

*Primary Examiner*—Gegory Wilson
(74) *Attorney, Agent, or Firm*—Rader, Fishman & Grauer PLLC

(57) ABSTRACT

A heat treatment table is divided into two or more regions, a heater is disposed for each region. On a predetermined portion of the heat treatment table, a plurality of sensors are disposed separately each other. A relation between temperatures of the respective portions on the heat treatment table and temperatures detected by the sensors is grasped in advance, thereby enables to surmise a temperature of the respective portion of the heat treatment table from the temperature detected by the sensors. In the case of an wafer being actually treated by placing on the heat treatment table, the temperatures detected by the sensors are observed, from these detected temperatures, the temperatures of the respective portions on the heat treatment table, that is, temperatures affecting the wafer, are surmised.

11 Claims, 19 Drawing Sheets

US 6,450,803 B2

HEAT TREATMENT APPARATUS

This application is a Division of Ser. No. 09/226,606 filed Jan. 7, 1999, U.S. Pat. No. 6,222,161 which is a Division of Ser. No. 09/260,031 filed Mar. 2, 1999.

BACKGROUND OF THE INVENTION

1. Field of the Invention

The present invention relates to a heat treatment apparatus such as a heater or a pre-heater to be assembled in a semiconductor manufacturing system for manufacturing semiconductor elements by use of a photomechanical process, for instance.

2. Description of the Related Art

Conventionally, in a semiconductor manufacturing system which employs a photomechanical process, various kinds of treatment units such as a resist coating unit, a drying unit, a heating unit and the like are assembled in one system. And, a string of treatments are carried out while transferring among these various kinds of treatment units in turn.

FIG. 12 shows a vertical cross section of a typical heat treatment unit 500.

In this heat treatment unit 500, a semiconductor wafer (hereinafter simply refers to as "wafers") W is disposed on an upper surface of a heat treatment table 501, and the wafer W is heated by heat evolved from the heat treatment table 501. In this heat treatment table 501, a heating mechanism which is not shown in the figure is integrated, the heat treatment table 501 is heated by heat supplied from this heating mechanism. On the upper surface of the heat treatment table 501, there are disposed a plurality of small projections which are not shown in the figure, the wafer W is disposed on the tops of these small projections, thus the lower surface of the wafer W is designed to be prevented from being scratched or stuck by dust due to contact between the lower surface of the wafer W and the upper surface of the heat treatment table 501. Therefore, between the lower surface of the wafer W and the upper surface of the heat treatment table 501, minute gaps are formed, and, from the upper surface of the heat treatment table 501, heat is supplied to the lower surface of the wafer W through a gas, for instance, a nitrogen gas in the gaps. The gas heated by the heat treatment table 501 and the wafer W, being smaller in its specific gravity than that of the surrounding air of lower temperature, ascends within the heat treatment unit 500, is collected in a cover assembly 502 disposed oppositely above the heat treatment table 501, and is evacuated through a piping 504 connected to the top 503 of the cover assembly 502.

Now, an wafer W is liable to be affected by heat. Thus, when the heat treatment temperature goes out of its allowed range, the quality of the semiconductor products deteriorates to lead to a lower yield, resulting in an increase of the manufacturing cost. Therefore, in such the heat treatment unit 500 as described above, a temperature sensor such as a thermocouple is inserted within the heat treatment table 501, temperature control is carried out based on the temperature detected thereby.

However, the temperature distribution of the heat treatment table is not necessarily uniform, thus correct detection of the temperature is difficult. To be correct, the temperatures are required to be measured directly of the respective parts by disposing a plurality of heaters and temperature sensors for the respective parts. However, since many temperature sensors are necessary, there are such problems that the manufacturing cost of the apparatus goes up and the structure of the apparatus becomes complicated.

In addition, in such the conventional heat treatment unit 500 as described above, in order to heat enough the gas between the upper surface of the heat treatment table 501 and the lower surface of the wafer W, the temperature of the heat treatment table 501 is required to be heated higher than the treatment temperature of the wafer W.

However, heat transmission from the heat treatment table 501 to the wafer W is not uniform, accordingly the heat tends to linger above the center of the wafer W, affecting a higher temperature there than the surroundings.

As the result, the heat treatment becomes nonuniform, the quality of the semiconductor elements formed on the wafer W tends to fluctuate, thereby produces problems that the yield of the semiconductor elements becomes low and the manufacturing cost of the semiconductor elements goes up.

The present invention was made to solve such problems. The objective of the present invention is to provide a heat treatment apparatus which is capable of implementing a uniform heat treatment all over the whole wafer W.

Another objective of the present invention is to provide a heat treatment apparatus which is capable of carrying out an accurate temperature control during the heat treatment of the wafer W.

SUMMARY OF THE INVENTION

The present invention was made to solve such problems. Still another objective of the present invention is to provide a heat treatment apparatus which is capable of controlling accurately the temperature with a small number of temperature sensors, accordingly capable of carrying out a uniform heat treatment all over the whole wafer W.

Further, still another objective of the present invention is to provide a heat treatment apparatus which is capable of carrying out an accurate temperature control during the heat treatment of the wafer W.

A heat treatment apparatus of the first invention, comprises:
- a heat treatment table thereon a substrate to be treated is disposed;
- two or more heaters for heating the each areas of the heat treatment table divided into two or more areas;
- at least a sensor detecting the temperature of the predetermined area of the heat treatment table;
- a means for predicting the temperatures of the each areas of the heat treatment table based on the detected temperature; and
- a means for controlling the output of the each heaters based on the temperatures predicted for the each areas so that the temperature of the whole heat treatment table becomes uniform.

Further, another embodiment of a heat treatment apparatus of the first invention, comprises:
- a heat treatment table thereon a substrate to be treated is disposed;
- two or more heaters for heating the each areas of the heat treatment table divided into two or more areas;
- at least one sensor for detecting the temperature of the predetermined area of the heat treatment table;
- a means for predicting an amount of heat to be supplied to the each area of the substrate to be heat treated based on the detected temperatures; and
- a means for controlling the output of the each heaters based on the predicted amount of heat so that the amount of heat to be supplied to the substrate to be treated becomes uniform.

The heat treatment apparatus of the second invention comprises a heating means for heating the lower surface of the substrate to be treated, and a means for cooling the gas heated to the predetermined temperature or more by the heating means above the substrate to be treated.

The heat treatment apparatus involving another embodiment of the second invention comprises a heating means for heating a lower surface of a substrate to be treated, a means for evacuating the gas heated by the heating means from an above portion of the substrate to be treated, a means for detecting the temperature affecting on the substrate to be treated, and a means for cooling, based on the detected temperature, the gas passing the above portion of the substrate to be treated.

DESCRIPTION OF THE PREFERRED EMBODIMENT

Example 1

In the following, the detailed description of the embodiments of the present invention will be given based on the drawings.

Incidentally, the scope of the present invention should not be construed to be restricted to that of the following embodiments.

Figure 1:
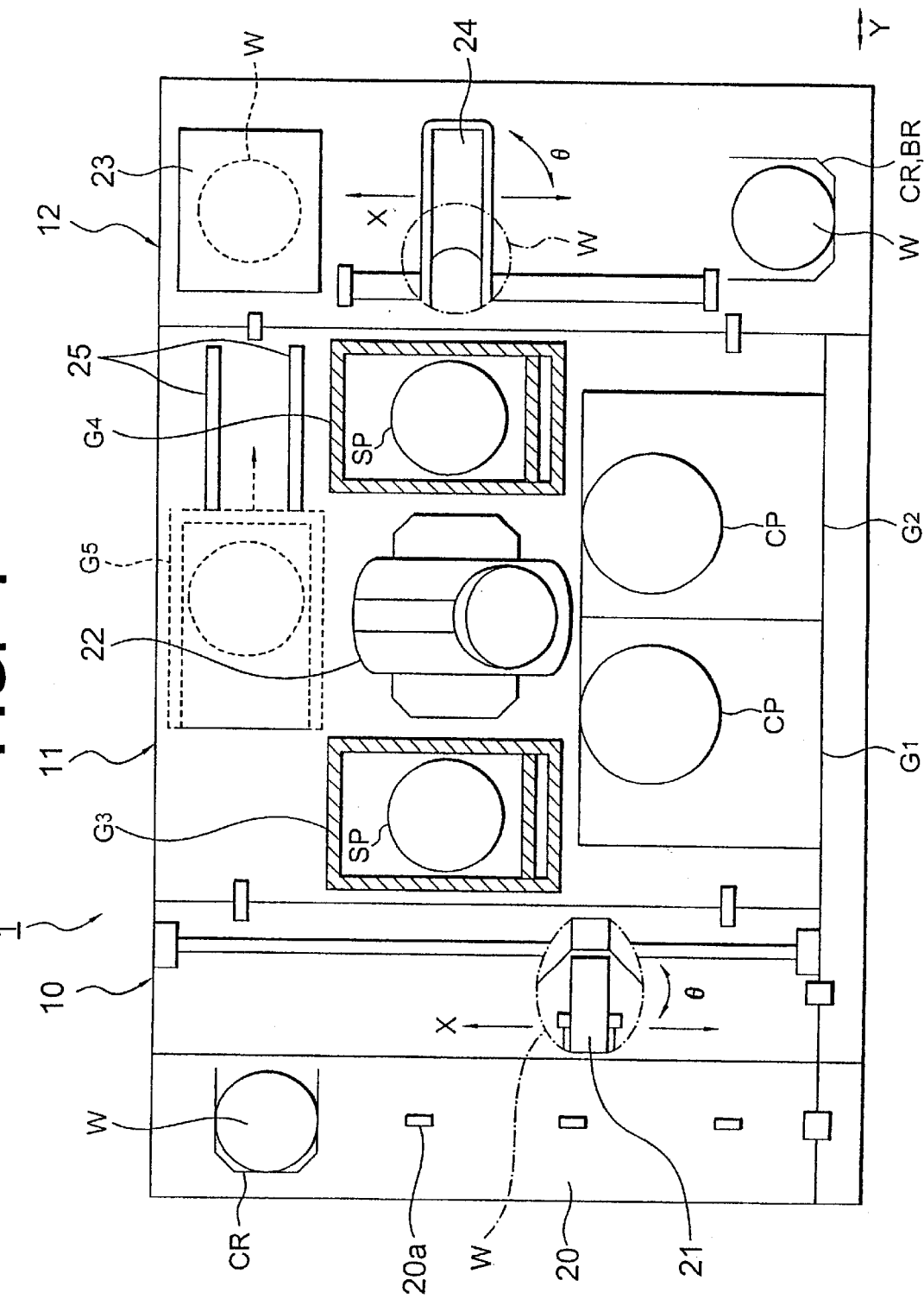
FIG. 1 is a plan view showing an entire structure of a coating/developing system involving the embodiment of the first invention.

FIG. 1 is a plan view showing the entire of a coating/developing system 1 of semiconductor wafers (hereinafter simply refer to as "wafer") which is provided with a resist coating unit (COT) involving one embodiment of the present invention.

In this coating/developing system 1, a cassette station 10 which carries in/out wafers, subjects to be treated, from the outside/inside by a wafer cassette CR by a plurality of pieces, that is, by a unit of 25 pieces for instance, or which carries in/out the wafers W to/from the wafer cassette CR, a treatment station 11 in which various kinds of treatment units of sheet-fed type which carry out the predetermined treatments to the respective wafers during the coating/development process are disposed multistage, and an interface portion 12 which delivers the wafers W between an exposure device (not shown in the figure) disposed adjacent to the treatment station 11, are connected integrally.

In this cassette station 10, at the place of a positioning projection 20a on a cassette stage 20, a plurality of pieces, up to 4 pieces for instance, of wafer cassettes CR are disposed directing the inlet/outlet of the respective wafers towards the treatment station 11 side in one line in X direction (the up and down direction in FIG. 1). And a wafer carrier 21 capable of moving in the direction where the cassettes are arranged (X direction) and in the direction where the wafers W accommodated in the wafer cassette CR are arranged (Z direction; vertical direction) makes a selective approach to the respective wafer cassette CR.

This wafer carrier 21 is capable of rotating freely in θ direction and also can make an approach to an alignment unit (ALIM) disposed to the multistage unit portion of the third treatment unit group $G_3$ on the treatment station 11 side which will be described later or an extension unit (EXT).

To the treatment station 11, a main wafer carrying mechanism 22 of vertically carrying type provided with a wafer carrier is disposed, the entire treatment units are disposed multistage in the surrounding thereof in one set or a plurality of sets.

Figure 2:
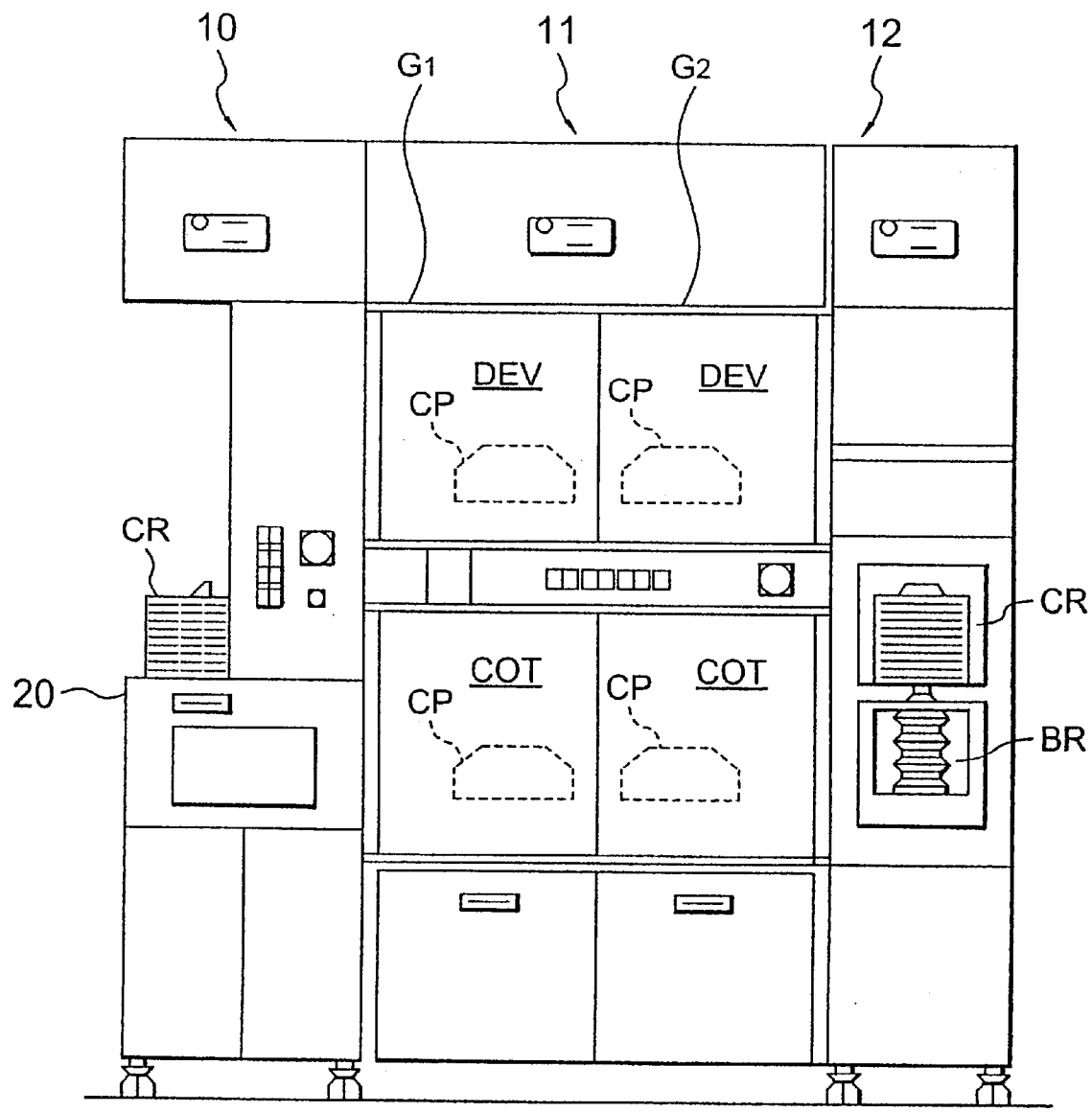
FIG. 2 is a front view of a coating/developing system involving the embodiment of the first invention.

FIG. 2 is a front view of the aforementioned coating/developing system 1.

In the first treatment unit group $G_1$, two sets of spinner type treatment unit for carrying out the predetermined treatment while holding an wafer W on a spin chuck in a cup CP, for instance a resist coating unit (COT) and a developing unit (DEV), are stacked in two stages from the bottom. In the second treatment unit group $G_2$, two sets of treatment unit of spinner type, for instance a resist coating unit (COT) and a developing unit (DEV) are stacked in two stages from the bottom. These resist coating units (COT), since the waste liquid of the resist liquid is troublesome from the mechanism and maintenance points of view, are preferable to be disposed at the lower stage. However, as the need arises, they can be disposed appropriately on the upper stage.

Figure 3:
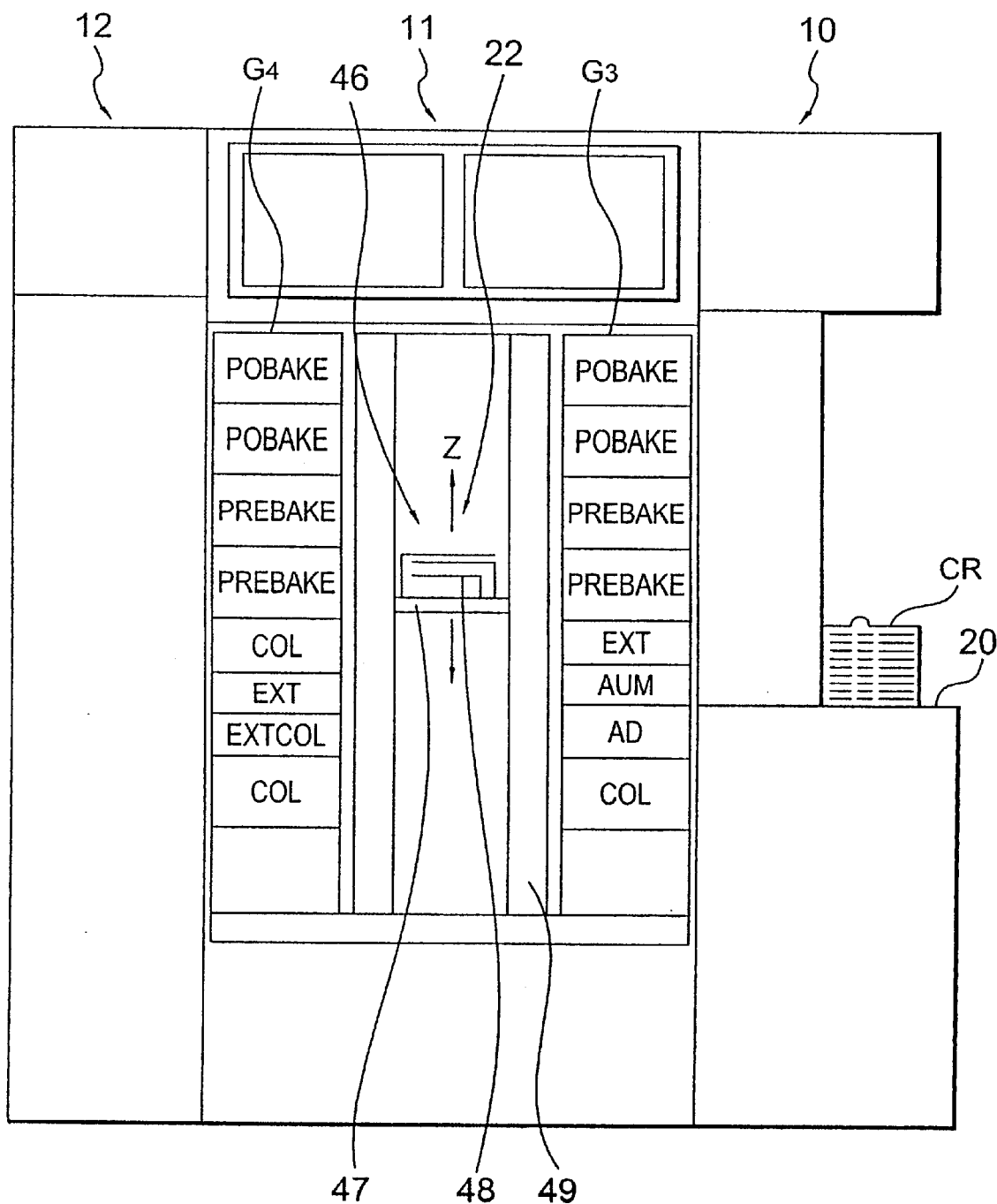
FIG. 3 is a rear view of a coating/developing system involving the embodiment of the first invention.

FIG. 3 is a rear view of the aforementioned coating/developing system 1.

In the main wafer carrying mechanism 22, inside a cylindrical supporter 49, an wafer carrier 46 is equipped movable freely in the up and down direction (Z direction). The cylindrical holder 49 is connected to a rotating axis of a motor (not shown in the figure), and, by the rotating driving force of this motor, rotates together with the wafer carrier 46 with the rotating axis as a center, thereby the wafer carrier 46 is made capable of rotating freely in the θ direction. Incidentally, the cylindrical supporter 49 may be constituted to be connected to another rotating axis (not shown in the figure) which is rotated by the motor.

To the wafer carrier 46, a plurality of holding members which are movable freely in the forward and backward direction of a carrier base 47 are disposed, these holding members 48 enable delivery of the wafers between the respective treatment units.

Further, as shown in FIG. 1, in this coating/developing system 1, 5 groups of treatment unit $G_1$, $G_2$, $G_3$, $G_4$, and $G_5$ are possible to be disposed, multistage units of the first and the second groups of treatment unit $G_1$ and $G_2$ are disposed in a front (this side in FIG. 1) side of the system, a multistage unit of the third group of treatment unit $G_3$ is disposed adjacent to the cassette station 10, a multistage unit of the fourth group of treatment unit $G_4$ is disposed adjacent to an interface portion 12, and a multistage unit of the fifth group of treatment unit $G_5$ can be disposed on the rear side.

As shown in FIG. 3, in the third group of treatment unit $G_3$, an oven type treatment unit for carrying out the predetermined treatment while holding the wafer W on a holding stage (not shown in the figure), for instance, a cooling unit (COL) for cooling, an adhesion unit (AD) for carrying out a so called hydrophobic treatment in order to heighten fixing property of the resist, an alignment unit for aligning (ALIM), an extension unit (EXT), a pre-baking unit (PREBAKE) for carrying out heat treatment preceding the exposure and a post-baking unit (POBAKE) for carrying out heat treatment after exposure are stacked in turn, in eight stages for instance, from the bottom. Even in the fourth group of treatment unit $G_4$, an oven type treatment unit, for instance a cooling unit (COL), an extension cooling unit (EXTCOL), an extension unit (EXT), a cooling unit (COL), a pre-baking unit (PREBAKE) and a post-baking unit (POBAKE) are stacked in turn, in eight stages, for instance, from the bottom.

By disposing the cooling unit (COL) and extension cooling unit (EXTCOL) of low treatment temperature at the lower stage as described above, and by disposing the pre-baking unit (PREBAKE), post-baking unit (POBAKE) and adhesion unit (AD) of higher treatment temperature at the upper stage, thermal interference between units can be made small. Naturally, random multistage disposition may be adopted.

As shown in FIG. 1, in the interface portion 12, the depth direction (X direction) possesses the dimension identical with the aforementioned treatment station 11, however the breadth direction (Y direction) possesses a smaller size. On the front portion of this interface portion 12, a portable pickup cassette CR and a fixed buffer cassette BR are disposed in two stages, whereas, on the rear portion, a periphery exposing device 23 is disposed, further, in the central portion, an wafer carrier 24 is disposed. This wafer carrier 24 makes an approach to both cassettes CR and BR, and the periphery exposing apparatus 23 by moving in the X direction and Z direction.

The wafer carrier 24 is capable of rotating freely even in θ direction, and can make an approach to an extension unit (EXT) disposed to the multistage unit of the fourth group of treatment unit $G_4$ on the treatment station 11 side, or an wafer delivery table (not shown in the figure) on the side of the adjacent exposing device.

Further, in the coating/developing treatment system 1, as described above, even to the rear side of the main wafer carrying mechanism 22, a multistage unit of the fifth group of treatment unit $G_5$ shown by the dotted lines in FIG. 1 may be disposed, however, the multistage unit of the fifth group of treatment unit $G_5$ can be moved in Y direction along a guide rail 25. Therefore, even in the case of the multistage unit of the fifth group of treatment unit $G_5$ being disposed as shown in the figure, by travelling along the guide rail 25, a space can be secured. Therefore, a maintenance operation to the main wafer carrying mechanism 22 can be carried out readily from the back.

Next, with reference to FIG. 4 and FIG. 5, constitutions and operations of the heat treatment unit such as baking units (PREBAKE) and (PROBAKE) and a cooling unit (COL) and (EXTCOL) which are included in the multistage units of the third and fourth groups $G_3$ and $G_4$ in the treatment station 11 will be described.

Figure 4:
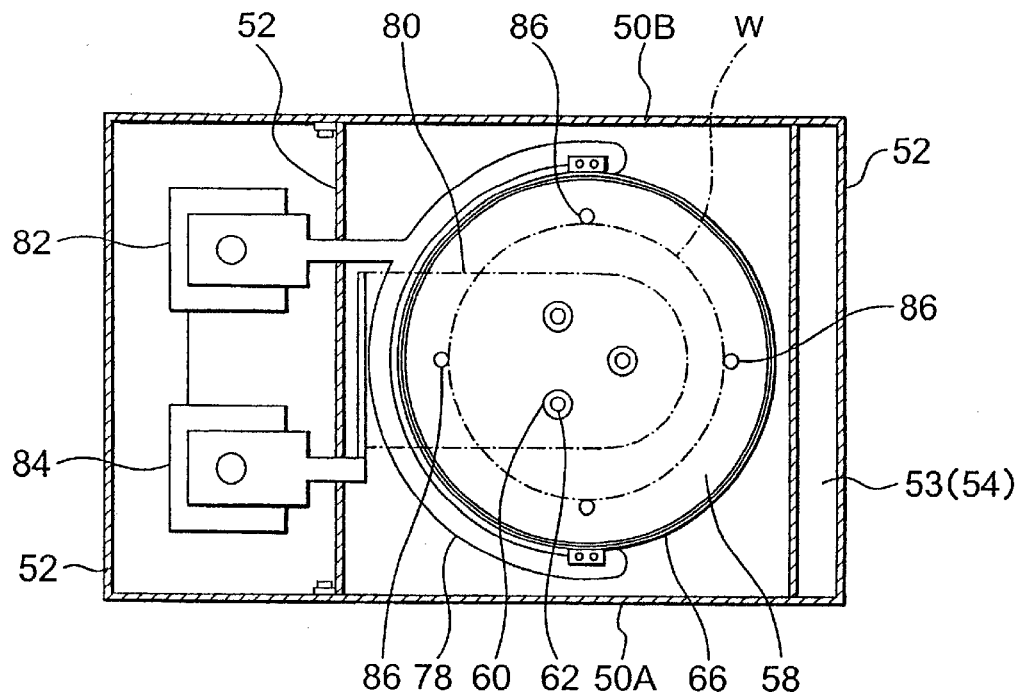
FIG. 4 is a plan view showing a constitution of a heat treatment unit involving the embodiment of the first invention.
Figure 5:
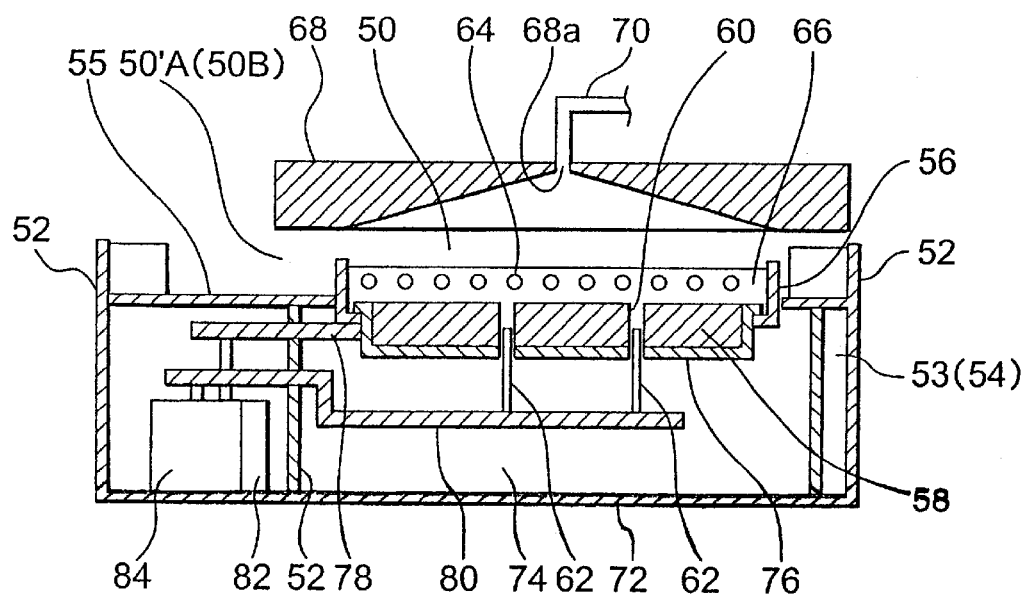
FIG. 5 is a cross-section of a heat treatment unit involving the embodiment of the first invention.

FIG. 4 and FIG. 5 are a plan view and a cross-sectional view showing a constitution of a heat treatment unit involving the present embodiment. Incidentally, in FIG. 5, a horizontal separating plate 55 is omitted for an illustration.

A treatment room 50 of this heat treatment unit is formed of both side walls 53 and the horizontal separating plates 55, and the front side (the side of main wafer carrying mechanism 24) and the rear side of the treatment room 50 are openings 50A and 50B, respectively. At the central portion of the separating plate 55, a circular opening 56 is formed, inside this opening 56, a disc like heat treatment table 58 is disposed as a stage for setting an wafer W.

To this heat treatment table 58, three holes 60, for instance, are bored, inside the each hole 60, a supporting pin 62 is pierced with play, and, when a semiconductor wafer W is loaded or unloaded, the each supporting pin 62 projects or ascends above the front surface of the heat treatment table 58, thereby delivery of the wafer W is carried out between the holding member 48 of the main wafer carrying mechanism 22.

On the exterior periphery of the heat treatment table 58, a shutter 66 consisting of a belt plate of ring shape in which many air holes 64 are formed with 2° apart in a circumference direction is disposed. This shutter 66 normally stays receded at a position below the heat treatment table 58, however, during heat treatment, ascends to the position higher than the upper surface of the heat treatment table 58 as shown in FIG. 5, thereby forms a side wall of ring shape between the heat treatment table 58 and the cover assembly 68, thereby a down-flow inert gas, nitrogen gas for instance, sent in from a gas supplying system not shown in the figure, can be flowed in uniformly in the circumference direction from the air holes 64.

At the central portion of the cover assembly 68, an exhausting opening 68a is disposed to evacuate the gas evolved from the surface of the wafer W during heat treatment, and, to this exhausting opening 68a, an exhausting pipe 70 is connected. This exhausting pipe 70 communicates with a duct 53 (or 54) of the front side of the apparatus (the side of the main wafer carrying mechanism 22) or a duct not shown in the figure.

Below the separating plate 55, a machine room 74 is formed out of the separating plate 55, both side walls 53 and a bottom plate 72, therein, a heat treatment table holding plate 76, a shutter arm 78, a supporting pin arm 80, a cylinder 82 for driving the shutter arm going up and down, and a cylinder 84 for driving the supporting pin arm going up and down are disposed.

As shown in FIG. 4, on a surface position of the heat treatment table 58 thereon the exterior periphery of the wafer W is placed, a plurality of pieces, four pieces for instance, of supporting projections 86 for guiding the wafer W are disposed.

Further, there are a plurality of small projections, which are not shown in the figure, on a part, thereon an wafer W is placed, of a upper surface of the heat treatment table 58, and the lower surface of the wafer W is placed on the tops of these small projections. Accordingly, there are formed minute spaces between the lower surface of the wafer W and the upper surface of the heat treatment table 58, thereby the lower surface of the wafer W is prevented from touching directly with the upper surface of the heat treatment table 58, thus even in the case of there being dust and the like, the wafer W is prevented from contamination or scratching taking place.

In addition, as will be described later, there are disposed a plurality of heaters inside the heat treatment table 58, by heating these heaters, the heat treatment table 58 can be maintained at the predetermined temperature.

Figure 6:
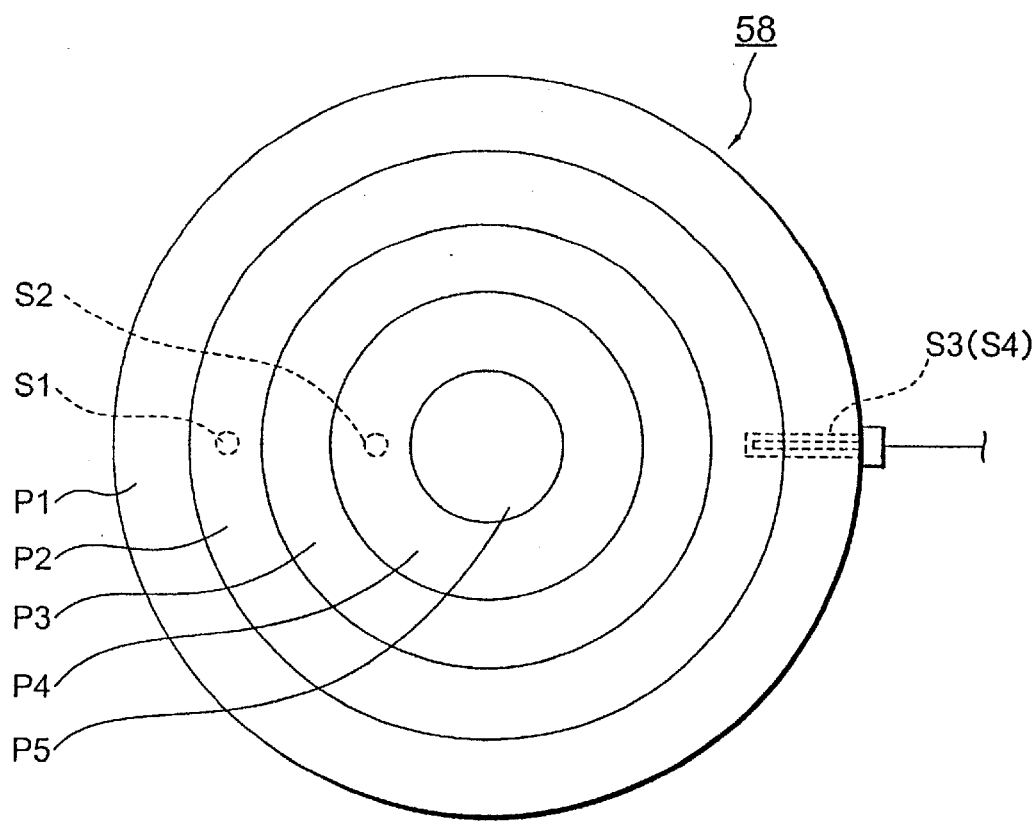
FIG. 6 is a plan view of a heat treatment table involving the embodiment of the first invention.
Figure 7:
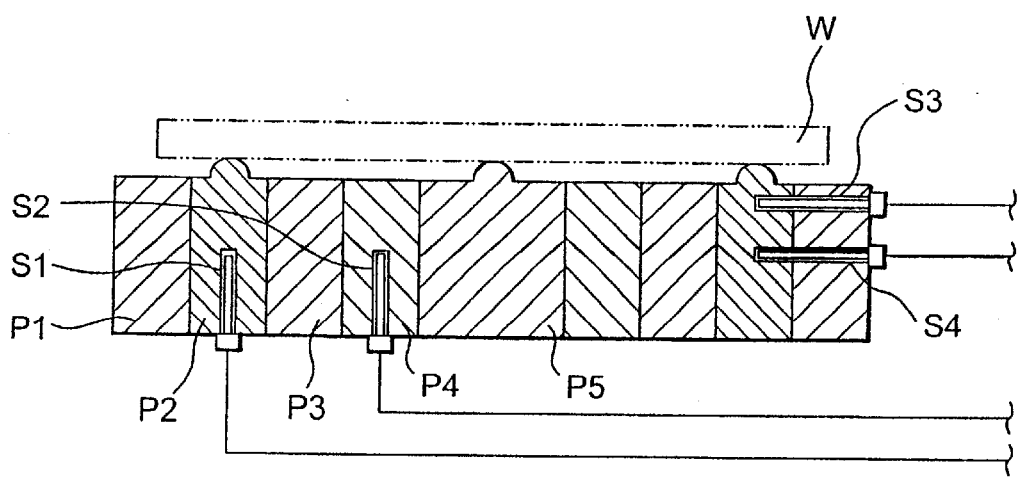
FIG. 7 is a vertical cross section of a heat treatment table involving the embodiment of the first invention.

FIG. 6 is a plan view depicting schematically a structure of the heat treatment table 58 involving an embodiment corresponding to the first invention, and FIG. 7 is a vertical cross section depicting schematically a structure of the same heat treatment table 58.

As shown in FIG. 6, this heat treatment table 58 is formed of five regions of from P1 through P5 of doughnut shape. These regions P1 through P5 are formed concentric, and, inside of P1 through P5, there are disposed heaters H1 through H5 which are independent each other, for instance, Nichrome heaters (not shown in the figure) are formed in the doughnut shape as identical as the respective regions P1 through P5. These heaters are wired independently each other, thereby the amount of heat to be supplied to the respective regions of P1 through P5 can be controlled independently each other.

To the second region P2 and the fourth region P4 from the outside of the heat treatment table 58, holes for attaching sensors are bored vertical, and into these holes, the sensor S1 and sensor S2 are attached vertical, respectively. These sensors detect the temperature distribution in the horizontal direction of the heat treatment table 58.

Further, from the direction of the right side surface in FIG. 6 of the heat treatment table 58, there are bored holes of the horizontal direction in parallel at two places up and down, these holes reach up to the midway of the region P2 piercing through the region P1.

As shown in FIGS. 6 and 7, also to these holes, sensors S3 and S4 are attached. These sensors S3 and S4 detect the temperature distribution in the vertical direction of the heat treatment table 58.

Figure 8:
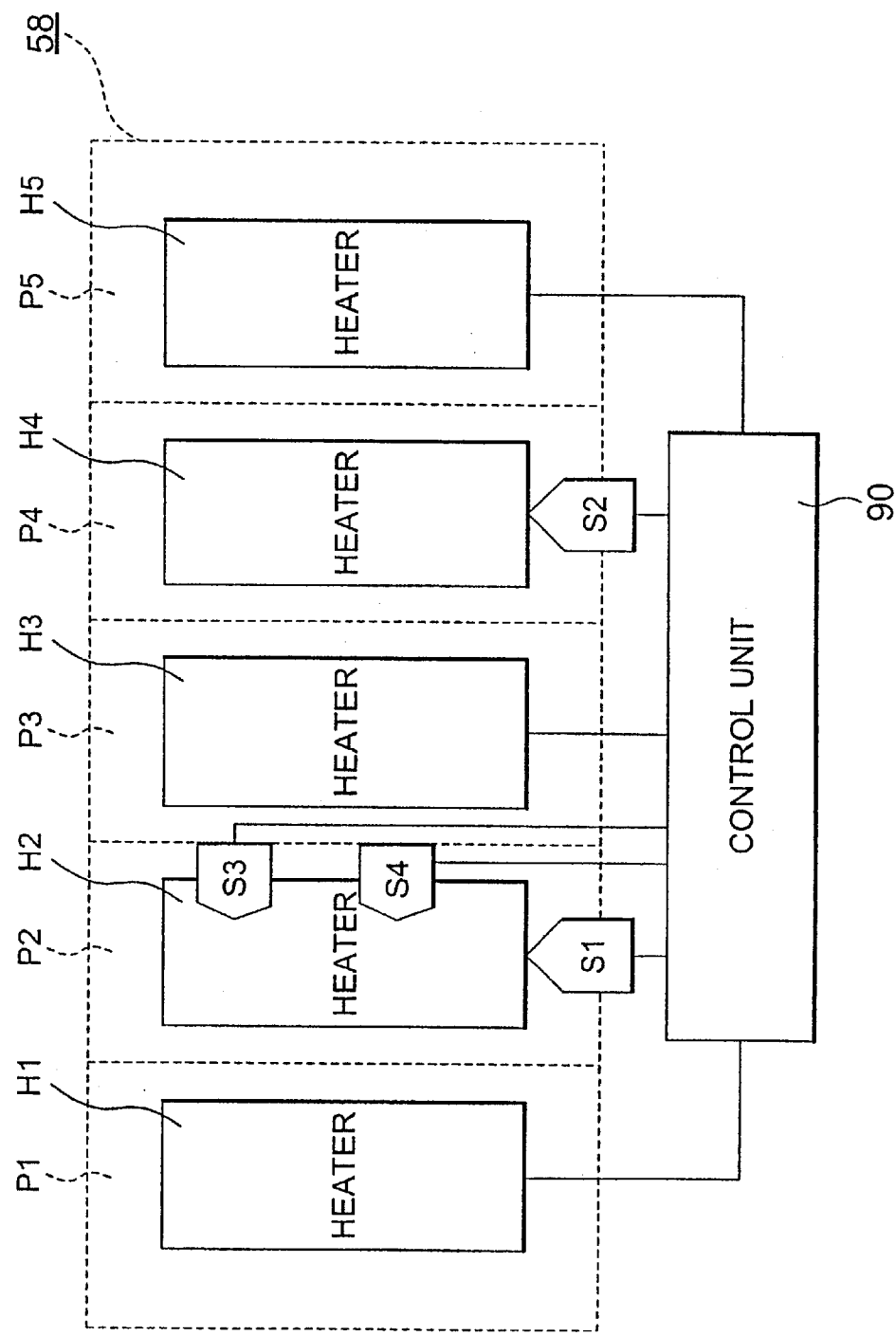
FIG. 8 is a block diagram showing a control system of a heat treatment unit involving the embodiment of the first invention.

FIG. 8 is a block diagram illustrating a control system of a heat treatment unit involving the present embodiment.

As shown in FIG. 8, inside the respective regions of P1 through P5 of the heat treatment table 58, there are disposed heaters H1 through H5, respectively. These heaters H1 through H5 are connected to a control unit 90, by this control unit 90 their output is controlled. Further, the sensors S1 through S4 are also connected to this control unit 90, thereby the temperatures of the respective parts of the heat treatment table 58 are recognized by the control unit 90.

Next, the way how to control the heat treatment unit involving the present embodiment will be described.

In the heat treatment unit involving the present embodiment, the temperatures of the predetermined parts of the heat treatment table 58 are detected, from these temperatures the temperature distribution of the entire heat treatment table 58 is surmised. Then, based on this surmised result, the output of the heaters H1 through H5 is controlled to prevent the thermal non-uniformity from occurring.

In the concrete, concerning the temperature distribution in the horizontal direction of the heat treatment table 58, the temperature distribution of the entire heat treatment table is surmised from the temperatures detected by the sensor S1 which is disposed in the region P2 second from the periphery of the heat treatment table 58 and the sensor S2 which is disposed in the region P4 fourth from the periphery of the heat treatment table.

For instance, when the same electric power is supplied to the heaters H1 through H5, in the case of the heat treatment table 58 having a tendency that the temperature is the minimum at the region P1, and as goes inside as P2, P3, . . . , goes up to the maximum at the region P5, the correspondence between the respective temperatures of the regions P2 and P4 where the sensors S1 and S2 are disposed and other regions P1, P3 and P5 than these is obtained from the measured values or theoretical values. And, by formulating a table which enables to specify the respective temperatures of the regions P1, P3 and P5 through specification of the temperatures of the sensors of S1 and S2 and the power supplies to the heaters of H1 through H5, this is memorized in the memory elements of the control unit.

Similarly, also in the case of the power supply to the heaters H1 through H5 being varied, the similar table is formulated, thereby enables to specify the respective temperatures of the region P1, P3 and P5 by specifying the temperatures of the sensors S1 and S2 and the respective power supplies to the heaters H1 through H5.

Thus, from the temperature signals detected by the sensors S1 and S2 and the power supply signals to the heaters H1 through H5, the temperature distribution of the entire heat treatment table 58 including the regions P1, P3 and P5 is surmised.

Next, based on the surmised temperature distribution of the entire heat treatment table 58, the electric power to be supplied to the each heater of H1 through H5 is adjusted to control the output of the each heater of H1 through H5 so that the temperature of the entire heat treatment table 58 becomes uniform.

In the concrete, based on the aforementioned table, the power supply to the each heater is adjusted to control the output of the each heater of H1 through H5 so that the regions P1 through P5 become uniform.

For instance, as mentioned above, in the case of the temperature of the region P1 being the minimum and, as goes inside as P2, P3, . . . , the temperature becoming higher to the maximum at the region P5, the output of the each heater of the heaters H1 through H5 is controlled to cancel such a thermal non-uniformity. That is, the output of the heater H1 is made high, that of the heater H5 is made low, and the output of the heaters H2 through H4 intervening them is made incline to connect continuously from the heater H1 to the heater H5. These output values of the heaters HI through H5 also are obtained based on the aforementioned table by use of the temperatures of the regions P2 and P4 as the indicators.

Further, in the heat treatment unit involving the present embodiment, also in the vertical direction of the heat treatment table 58, the sensors S3 and S4 are disposed. And, based on the temperatures detected by these sensors S3 and S4, the temperature distribution in the vertical direction of the entire heat treatment table 58 is surmised, thereby the temperature of the heat treatment table 58 is administered.

In the concrete, with the sensors S3 and S4, the temperatures in the vertical direction of the region P2 are detected. On the other hand, the correspondence between the detected temperatures of the sensors S3 and S4 and the temperature distribution in the vertical direction of the each region of the P1 through P5 of the heat treatment table 58, and the relation with the output of the each heater of H1 through H5 are obtained in advance from the measured values or the theoretically calculated values, they are memorized as identically as the above in the memory part of the control unit.

Then, with the temperatures detected by the sensors S3 and S4 at two places, high and low, of the region P2 as the indicators, the temperature distribution of the surface of the heat treatment table 58 is surmised. That is, from the temperatures of the region P2 detected by the sensors S3 and S4, by use of the aforementioned table, the temperatures in the neighborhood of the surface of the other region P1 and P3 through P5 are surmised. Then, in the case of the surface temperature of each region of the regions P1 through P5 being irregular, the output of the heaters H1 through H5 is controlled by use of the aforementioned tables so that the surface temperature of the heat treatment table 58 becomes uniform and adequate.

Next, operation in the case of this heat treatment unit being employed as a baking unit (PREBAKE) and cooling unit (COL) will be described in the followings.

First, from inside an wafer cassette CR which is set on a stage 20, an wafer W is pulled out by an wafer carrier 21, then the wafer W is delivered from the wafer carrier 21 to a main wafer carrying mechanism 22. The main wafer carrying mechanism 22 carries the delivered wafer W into a resist coating unit (COT) and sets, here resist coating is carried out on the wafer W. Then, the wafer W is pulled out from inside the resist coating unit (COT) by the main wafer carrying mechanism 22, carried into the aforementioned heat treatment unit, and set on the heat treatment table 58.

On the other hand, at the same time with power input to the heat treatment unit, power is began to be input to the heaters H1 through H5 within the heat treatment table 58. When the temperature of the heat treatment table 58 becomes stable after the predetermined time period elapsed, the control unit 90 starts to operate to adjust the output of the heaters H1 through H5.

That is, with the sensors S1 and S2 disposed at the regions P2 and P4, the temperature adjustment of the horizontal direction of the heat treatment table 58 is carried out, thereby the heat treatment table 58 is controlled so that the temperature is maintained adequate and uniform.

For instance, in the case of the temperature being low in the region P1, and, as the region goes inside as P2, P3, . . . , becoming high to be the maximum at the region P5, the output of the heater H1 is made high, and, as the heater goes inside as H2, H3, . . . , the output is made low to be the minimum at the heater H5.

On the contrary, in the case of the temperature being high at the region P1, and, as the region goes inside as P2, P3, . . . , becoming low to be the minimum temperature at the region P5, the output of the heater H1 is made low, and, as the heater goes inside as H2, H3, . . . , the output is increased to be the maximum at heater H5.

Similarly, in the case of the temperatures of the regions P1 and P5 being low and the these of the regions P2 through P4 being high, whereas the output of the heaters H1 and H5 are made high, the output of the heaters H2 through H4 are made low. Here, for the output value of the each heater of the aforementioned each case, the most adequate value are obtained based on the aforementioned tables, the output value being adjusted to these values.

Further, also as to the temperature distribution in the vertical direction of the heat treatment table 58, similarly, based on the temperature detected from the sensors S3 and S4 and the aforementioned table, the temperature distribution on the surface of the heat treatment table 58 is surmised, thereby the output of the heaters H1 through H5 is controlled so that the temperature of the entire surface of the heat treatment table 58 becomes adequate and uniform.

Incidentally, in this embodiment, by controlling only the output of the heaters H1 through H5, the temperature control of the heat treatment table 58 is carried out, however, by other method than this, for instance, by controlling the gas flow rate of the gas supply system which supplies a gas such as a nitrogen gas from the side direction of the heat treatment table 58, the temperature control of the heat treatment table 58 can be carried out.

Thus, in the heat treatment unit involving the present embodiment, whereas the heat treatment table is divided into a plurality of regions to dispose a heater for every region, the sensors detecting the temperatures of the heat treatment table are disposed only for the predetermined parts. On the other hand, the thermal correspondence as to the heat transmission state between the region where the sensors are disposed and other parts of the heat treatment table than these are obtained from the measured values or the theoretical values to memorize in the memory part of the control unit. When the temperature control of the heat treatment table is actually carried out, for the predetermined parts, the temperatures are actually detected by the sensors, and, for the other parts than these, the temperatures are obtained by surmising from the data of the thermal correspondence memorized in the memory part.

In the case of, as the result of this surmise, the surface temperature of the heat treatment table being expected to be non-uniform, the output of the heaters is controlled based on the aforementioned data so that the temperature of the heat treatment table is adequate and uniform.

Thus, in the heat treatment unit involving the present embodiment, the sensors are disposed only to the predetermined parts, and other parts than these are constituted so that the temperature distribution is surmised with the mathematical method by use of the measured values or theoretical values. Therefore, the temperature control of the heat treatment table can be carried out with a smaller number of sensors against a plurality of heaters.

Further, in the heat treatment unit involving the present embodiment, in the case of, from the above surmised results, the thermal irregularity being liable to occur as to the temperature distribution of the heat treatment table, the output of the heaters is controlled based on the data of the thermal correspondence so that this thermal irregularity is cancelled. Therefore, the temperature control can be carried out with high accuracy.

Incidentally, the present invention is not restricted to the content of the aforementioned embodiments.

For instance, though, in the aforementioned embodiment, the temperature distribution of the entire heat treatment table is surmised from the temperatures detected for the predetermined parts of the heat treatment table, by surmising further the heat amount affecting the wafer W placed on the heat treatment table, the heaters can be controlled so that the amount of heat affecting the wafer W is made uniform.

Further, in the above embodiments, the heat treatment table is divided into a plurality of concentric regions, and a heater formed in doughnut shape is incorporated in every region. However, the heat treatment table can be divided in the diameter direction or in various forms such as a sector form heater or the like.

Further, also as to the number of the sensor, only one sensor can be disposed or the sensors of the same number as that of the heater or more can be disposed.

Further, in the above embodiments, description is carried out of the coating/developing system 1 of the wafer W as an example, however, the present invention can be applied also to the treatment apparatus other than this, for instance, an LCD substrate treatment apparatus and the like.

Example 2

Next, another embodiment involving the first invention will be described.

Incidentally, the parts repeating the aforementioned example 1 will be omitted from the following description.

Figure 9:
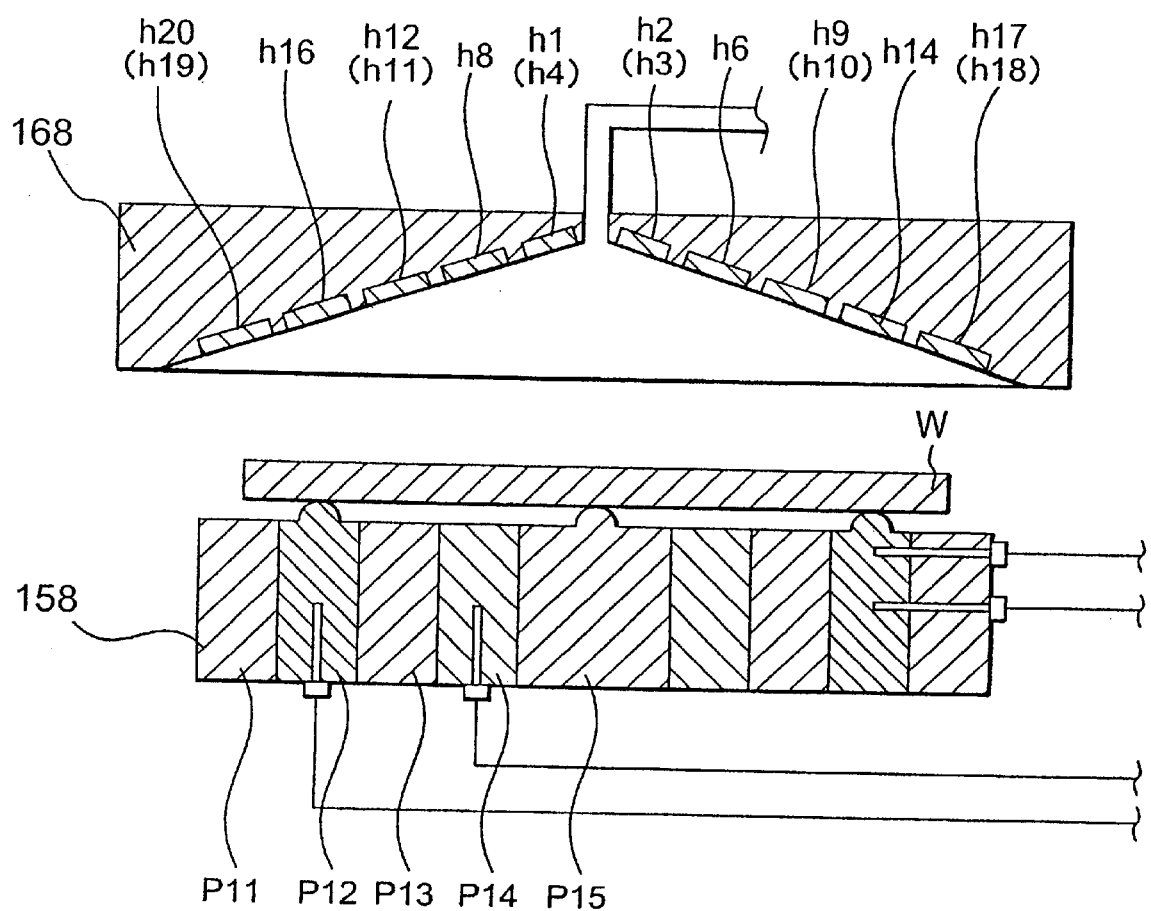
FIG. 9 is a vertical cross section of a heat treatment unit involving another embodiment of the first invention.
Figure 10:
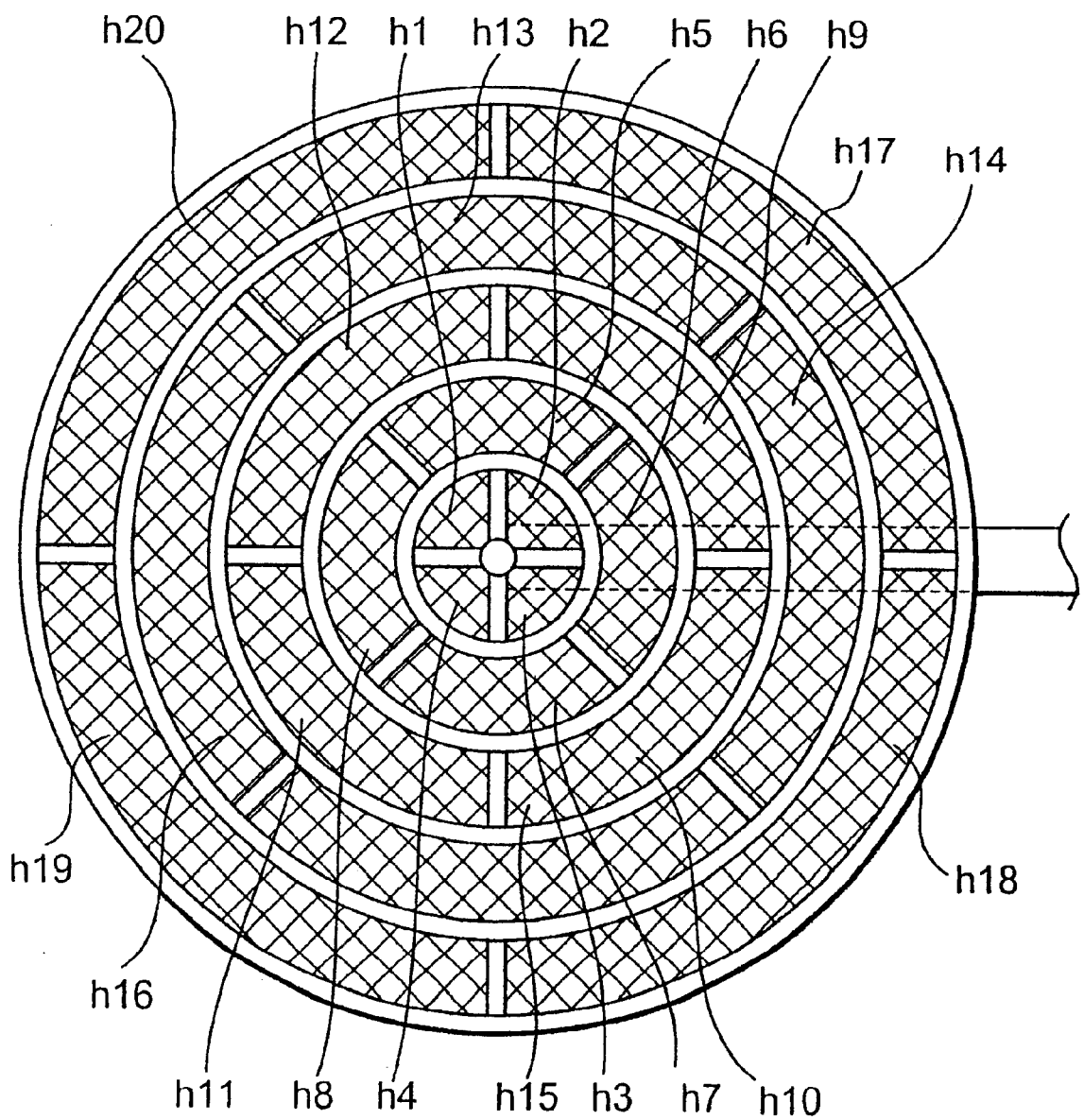
FIG. 10 is a plan view showing a state seen from the lower side of a cover assembly and involving another embodiment of the first invention.

FIG. 9 is a vertical cross section of the heat treatment table 158 and cover assembly 168 of the heat treatment unit involving the present embodiment, and FIG. 10 is a plan view showing a state seen from the bottom of the cover assembly 168.

As shown in FIG. 9, on a wall surface 168b formed conical on the lower surface side of the cover assembly 168, upper heaters of sector shape h1 through h20 are disposed. As shown in FIG. 10, these upper heaters h1 through h20 are disposed in such a manner that the five concentric circles, large and small, are divided into four, respectively, on the wall surface 168b.

Figure 11:
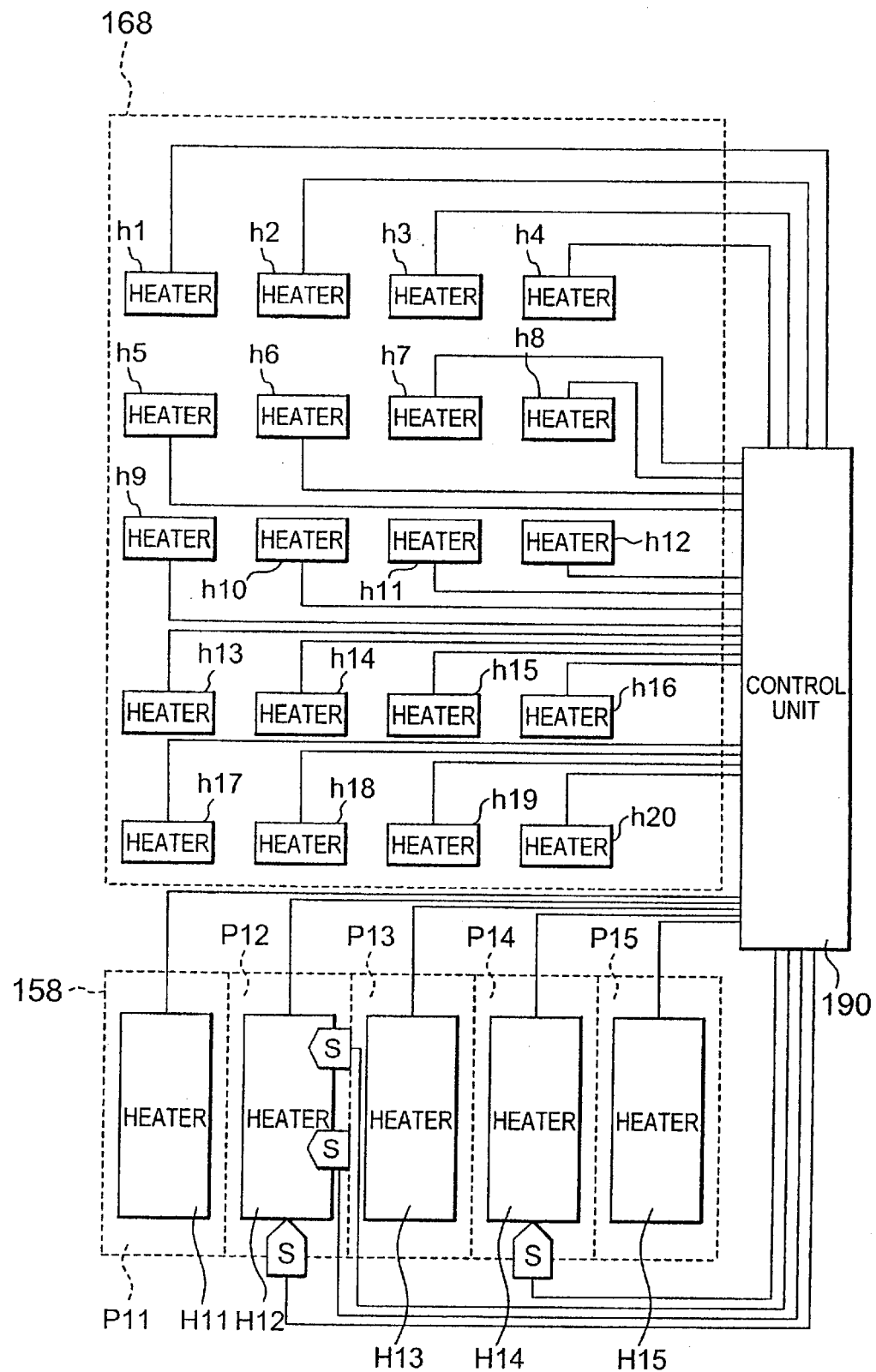
FIG. 11 is a block diagram illustrating a control system of a heat treatment unit involving another embodiment of the first invention.
Figure 12:
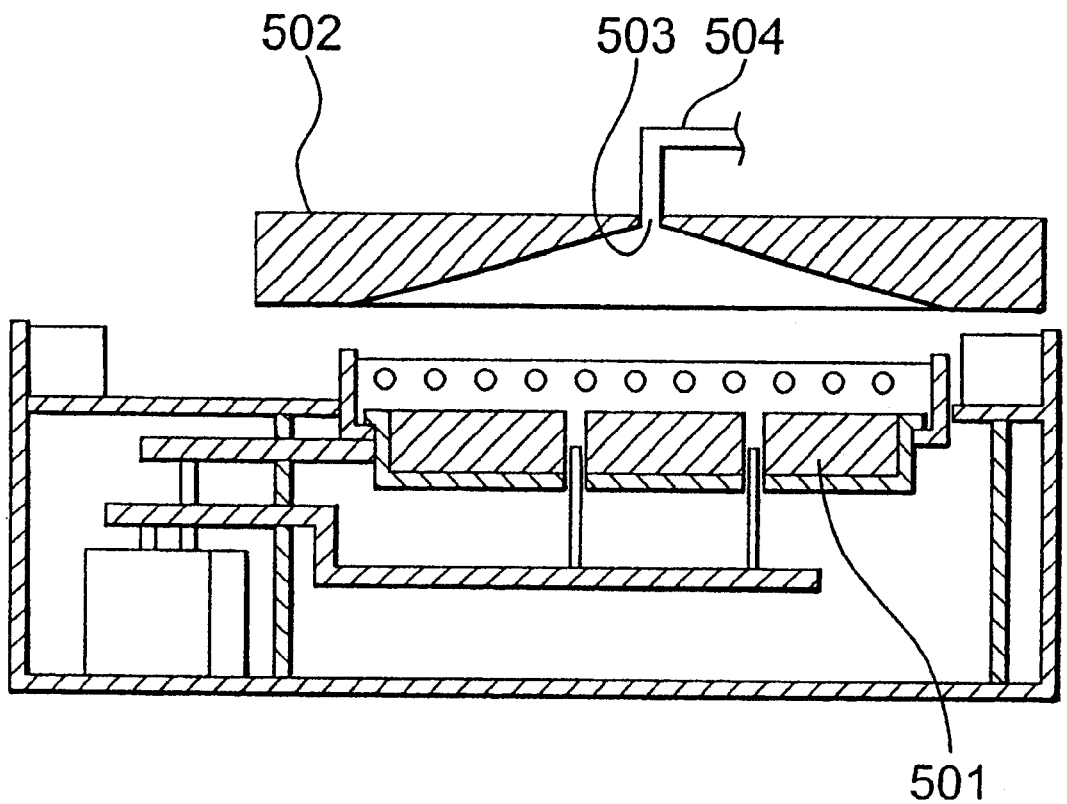
FIG. 12 is a vertical cross section of a conventional heat treatment unit.

FIG. 11 is a block diagram showing a heating system of the heat treatment unit involving the present embodiment. As shown in FIG. 11, for each upper heater of h1 through h20, wiring is given independently each other, by the control unit 190 thereto each heater is connected, the operation or the amount of heat of evolution thereof can be controlled.

In the heat treatment unit involving the present embodiment, in addition to the heat treatment table 158 of the utterly identical structure as that of the heat treatment table 58 involving the aforementioned first embodiment, a cover assembly 168 thereon the upper heaters h1 through h20 are disposed is given.

In this heat treatment unit, from the temperatures of the regions P11 and P12 which are detected by the sensors S11 and S12 disposed to the regions P12 and P14 of the heat treatment table 158 and the output of the respective heaters H11 through H15, whether the temperature distribution is adequate or not, or uniform or not, is judged.

That is, as identical as the aforementioned first embodiment, from the thermal correspondence of the each regions of the heat treatment table which is memorized in the memory part of the control unit 190, the temperature distribution of the entire heat treatment table 158 is surmised, thereby whether the state of the temperature distribution is adequate or not, uniform or not, is judged.

And, in the case of the temperature distribution being judged to be inadequate, and the thermal non-uniformity being judged to be present, in order to cancel this thermal non-uniformity, the heaters H11 through H15 are controlled. At the same time, the amounts of heat of evolution of the upper heaters h1 through h20 disposed on the lower surface of the cover assembly 168 are controlled to cancel the thermal non-uniformity.

For instance, in the case of the periphery portion of the exterior circumference of the heat treatment table being low in its temperature, the amount of the heat of evolution of the upper heaters h17 through h20 on the side of the periphery of the exterior circumference is increased, and in the case of there occurring partly the portion of lower temperature, the amount of the heat of evolution of the upper heaters positioning immediately above those portions is increased to accomplish the uniform heat treatment of the wafer W.

Further, in the case of the cover assembly 168 involving the present embodiment being adopted, the amount of the heat of evolution of the heat treatment table 158 is controlled so that the temperature becomes a little bit lower than that of the heat treatment of the wafer W, on the other hand, the amount of the heat of evolution of the upper heaters h1 through h20 is controlled so as to make the temperature higher than the temperature of heat treatment of the wafer W, thereby the temperature gradient is formed such that the temperature varies vertically toward the upper direction from a low temperature to a high temperature. By carrying out the heat treatment like this, the thermal convection can be prevented from occurring above the neighborhood of the center of the wafer W. Thus, an effect characteristic to the present embodiment such that the control of the temperature of the heat treatment can be carried out readily is obtained.

As described above in detail, according to the first invention, whereas the heaters are disposed on the two or more regions, respectively, which are formed by dividing the heat treatment table, the sensors are disposed on the predetermined positions of the heat treatment table. Based on the temperatures detected by these sensors, the temperature of the each position of the heat treatment table is surmised. Therefore, the temperature control can be carried out with a small number of sensors.

Further, based on thus surmised temperature, the output of the each heater is controlled so that the temperature of the entire heat treatment table becomes uniform. Thus, all over the heat treatment plate, the uniform heat treatment can be carried out.

With an arithmetic unit, based on the temperature detected above, if the temperature of the each position of the heat treatment table is surmised mathematically, the temperature control during heat treatment of the substrate to be treated can be carried out with high accuracy.

In the case of a plurality of the upper heaters which are disposed divided concentric being disposed above the heat treatment table, on the surface, opposing to the heat treatment table, of the cover assembly which is disposed opposite to the heat treatment table, since the heating is carried out from above and below the wafer, heating efficiency is good and the uniform heat treatment can be carried out.

Further, by setting the temperature of the upper heater side at the higher temperature with respect to the lower heater, or by controlling the lower heaters or upper heaters so as to cancel the thermal unbalance, the temperature control during heat treatment of the substrate to be treated can be carried out with high accuracy.

Further, by disposing the respective heaters concentric on the heat treatment table, with respect to the diameter direction of the heat treatment table in which direction the thermal non-uniformity tends to occur, a more delicate temperature control can be carried out, thus all over the substrate to be treated, the uniform heat treatment can be carried out.

Further, by disposing the sensors in one line in the diameter direction of the heat treatment table, a small number of the sensors can realize an accurate temperature control.

Further, by disposing the sensors in the thickness direction of the heat treatment table, the time lag due to the thermal transmission in the thickness direction can be readily corrected, thereby management of the temperature of heat treatment or the temperature control during the heat treatment of the substrate to be treated can be carried out with high accuracy.

Example 3

Figure 13:
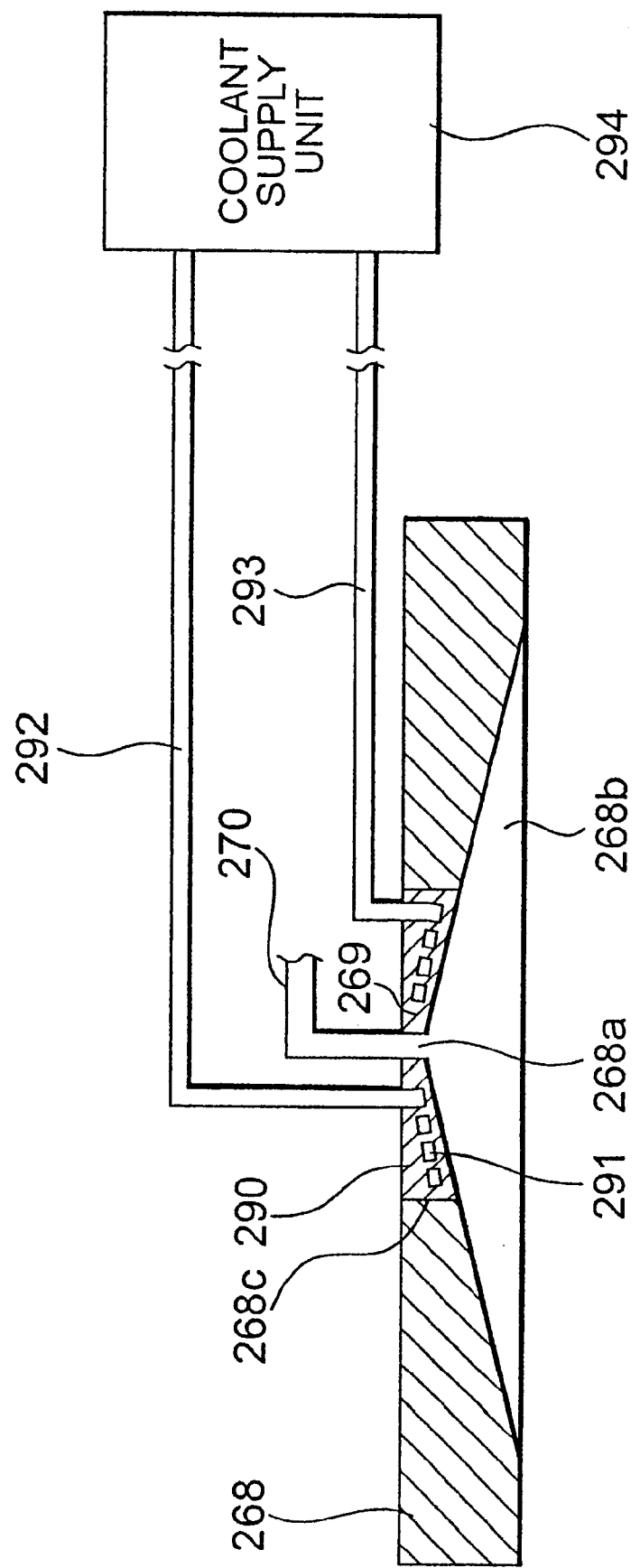
FIG. 13 is a vertical cross section of a cover assembly involving the embodiment of the second invention.
Figure 14:
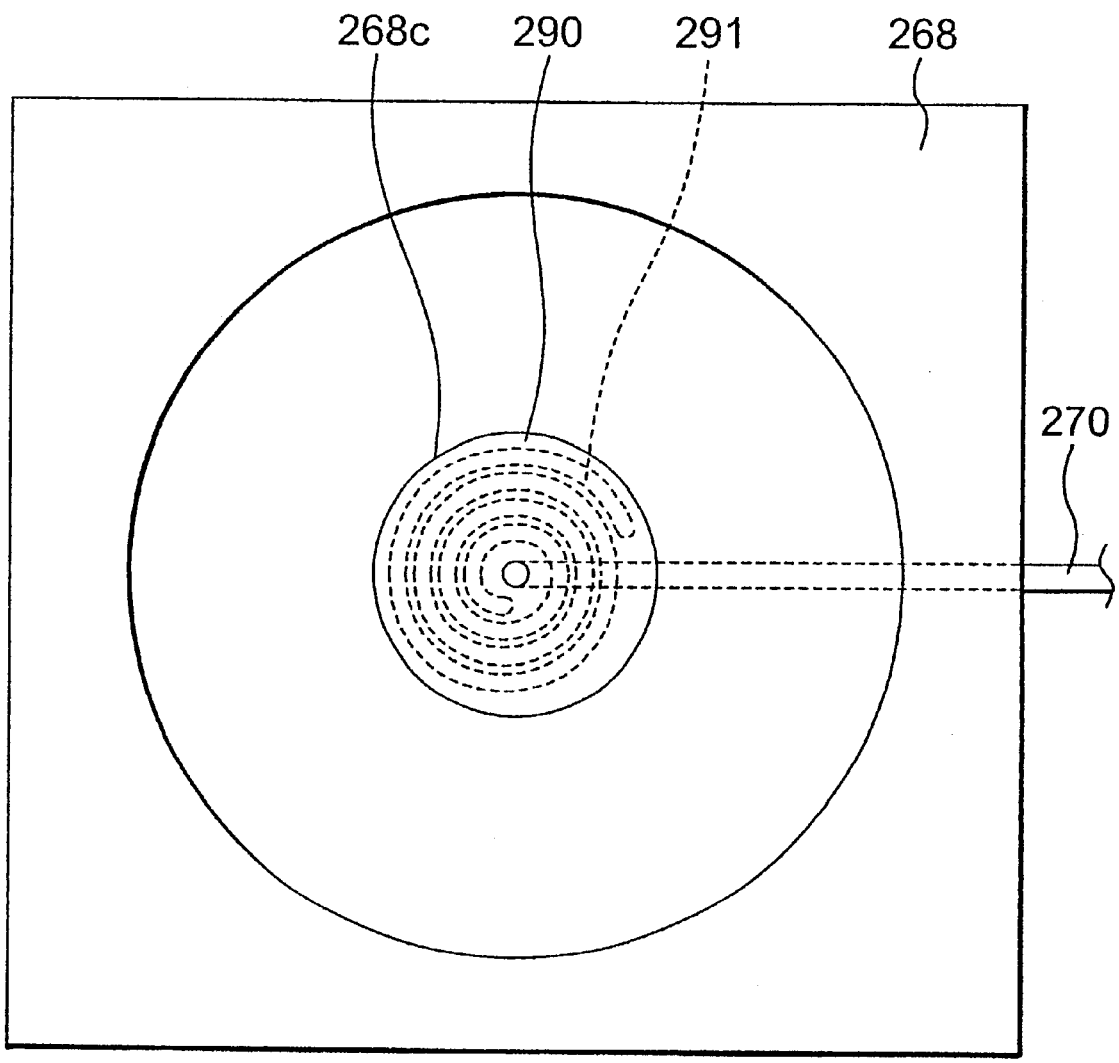
FIG. 14 is a plan view of a state seen from the lower side of a cover assembly and involving the embodiment of the second invention.

FIG. 13 is a vertical cross section of a cover assembly 268 involving one embodiment corresponding to the second invention, and FIG. 14 is a plan view showing a state seen from the bottom side of the cover assembly 268. As shown in FIG. 13, on the lower surface side of the cover assembly 268, a conical concave portion 168b is formed, and at the summit of the cone, an exhaust outlet 268a is disposed, and a lower end of an exhausting pipe 270 is connected to this exhaust outlet 268a. The other end side of the exhausting pipe 270 is connected to a not shown exhausting system, the heating gas (nitrogen gas) which is heated by the thermal surface plate and went up is collected by the conical concave portion 268b, and evacuated through the exhaust outlet 268a and exhausting pipe 270.

On the central portion of the conical concave 268b, a through hole 268c is disposed, and to this through hole 268c, a jacket for cooling a gas (hereinafter refers simply as "jacket") 290 is attached.

This jacket is a cooler for cooling the heating gas (nitrogen gas) which is heated by the thermal surface plate 258 and ascended the space between the thermal surface plate 258 and the cover assembly 268. The jacket 290 has an appearance of a disc in the center of which the exhaust outlet 268a is bored, the upper surface thereof is a plane, and, on the lower surface thereof, the conical concave 268b is formed. The size of its diameter is nearly equal with that of the through hole 268c of the cover assembly 268, and that is designed just to be accommodated in the through hole 268c.

The jacket 290 is made out of materials of high thermal conductivity such as light alloys of aluminum or copper, and inside thereof a path 291 for circulating a coolant is formed.

In the jacket 290 involving the present embodiment, as shown in FIG. 14, the circulation path 291 has a shape formed in spiral with the exhaust outlet 268a as its center, at the both ends of the circulation path 291, pipes 292, 293 for letting in or out the coolant are connected. The other end sides of these pipes 292, 293 are connected to a coolant supplier 294, and the coolant cooled to the predetermined temperature by this coolant supplier 294 is circulated inside the circulation path 291 through the pipes 292 and 293.

Incidentally, in the jacket 290 of the present embodiment, there is explained a method in which the coolant is circulated inside the jacket, however, one in which no coolant is used, for instance, air cooling type, or an electrical one employing a Peltier element can be employed.

Figure 15:
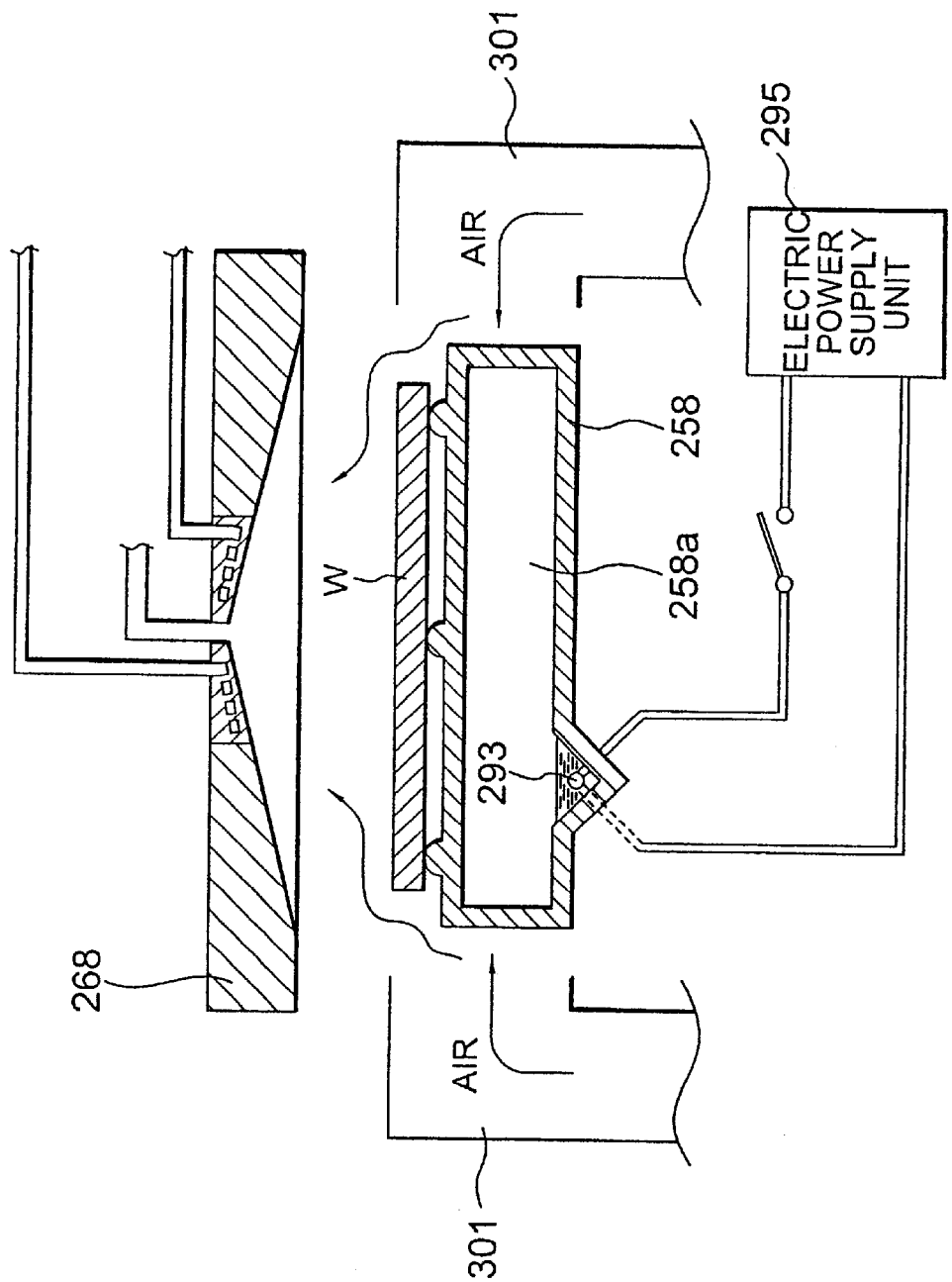
FIG. 15 is a vertical cross section showing schematically a structure in the neighborhood of a thermal surface plate involving the embodiment of the second invention.

FIG. 15 is a vertical cross section showing schematically a structure of a thermal surface plate 258 involving the present embodiment and its neighborhood. As shown in this FIG. 15, the inside of the thermal surface plate 258 forms a sealed cavity 258a, and, on a part of the bottom portion, a reservoir 258b of heating medium of which the cross section is formed in a V character shape is disposed. Within the reservoir 258b of the heating medium, a heater 293 made out of Nichrome wire or the like is disposed in a direction perpendicular to the plane of the paper of FIG. 15, and to this heater 293, electric power is supplied from an electric power source 295 controlled by a control unit not shown in the figure.

When the power is supplied to the heater 293 from the electric power source 295, the heater 293 starts to evolve heat, and the heating medium reserved in the reservoir 258b of heating medium through condensation is heated by the heater 293. The heated heating medium is vaporized/evaporated to circulate inside the cavity 258a. When the vapor of the heating medium collides the cooled part inside the cavity 258a, the vapor of the heating medium gives the amount of heat to this cooled portion, at the same time, is condensed to liquefy. The amount of heat given at this time from the heating medium to the thermal surface plate 258 is the heat of vaporization of the heating medium, being determined by the kind of the heating medium. Therefore, when a sequence of a cycle from the vaporization of the heating medium to condensation thereof becomes stable to establish a stable state, the temperature of the thermal surface plate can be maintained at the almost constant temperature.

Upon the gas (nitrogen gas) of room temperature being sent from the side direction of the thermal surface plate 258 maintained at a constant temperature through an airhole 301, the gas is heated at the surface of the thermal surface plate 258 to be the heating gas, and due to collision of the heating gas against the wafer W disposed on the thermal surface plate 258, the amount of heat is supplied to the wafer W.

Figure 16:
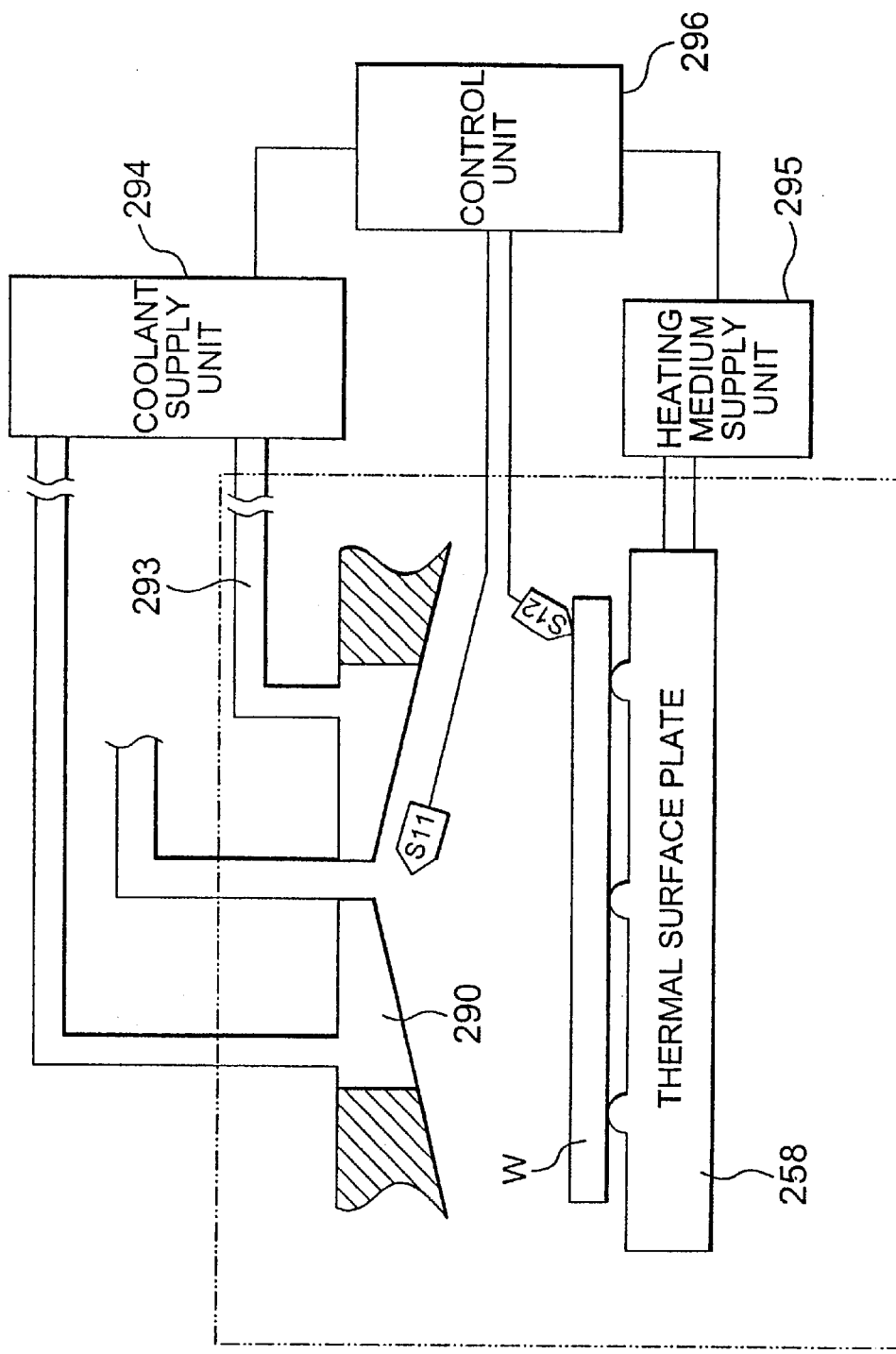
FIG. 16 is a block diagram showing a control system of a heat treatment unit involving the embodiment of the second invention.

FIG. 16 is a block diagram illustrating a control system of a heat treatment unit involving the present embodiment. As shown in FIG. 16, in the heat treatment unit involving the present embodiment, an electric power supply 295 which supplies the electric power to the thermal surface plate 258 and a coolant supplier 294 are connected to a control unit 296. To this control unit 296, there are further connected a sensor S11 which detects the temperature of the gas (nitrogen gas) in the neighborhood of the center of the lower surface of the jacket 290, and a sensor S12 which detects the temperature of the wafer W disposed on the thermal surface plate 258. The control unit 296, based on the temperature of the heating gas and the temperature of the wafer W detected by these sensors S11 and S12 respectively, controls the thermal surface plate 258 and the jacket 290.

For the sensors S11 and S12, the various kinds of known temperature sensors can be employed appropriately, however, in order to detect the temperature of the wafer W, a sensor which can detect the temperature in a non-contact state such as a sensor of a mechanism which detects the temperature from the radiated infra-red light or the like, for instance, is preferable.

Further, for the temperature of the thermal surface plate 258, as identical as the aforementioned jacket 290 and the wafer W, a sensor is disposed to detect directly the temperature, and the detected temperature can be sent to the control unit 296, however, the temperature of the thermal surface plate 258 can be controlled from the temperature of the heating medium of the power supply 295 or the supplied power.

Next, a method for controlling the heat treatment unit involving the present embodiment will be described.

The thermal surface plate 258 is controlled to maintain a constant temperature a little bit higher than that of the heat treatment of the wafer W.

As described above, the temperature of the thermal surface plate 258 is controlled based on a temperature sensor (not shown in the figure) disposed exclusively or the supplied power from the electric power supply 295.

The temperature actually affecting the wafer W which is exposed to the heat treatment is detected by the sensor 12.

The gas (nitrogen gas) heated by the thermal surface plate 258 ascends up and gathers in the neighborhood below the exhaust outlet 268a of the jacket 290, accordingly, by the sensor S11 disposed in the neighborhood thereof, the temperature of the heating gas can be detected.

In the case of this temperature being higher than the predetermined temperature, together with adjusting the temperature of the thermal surface plate 258, the coolant supply 294 is operated to circulate a cold coolant inside the jacket 290, thereby cools the overheated gas (air or an inert gas such as a nitrogen gas or the like). The gas cooled here becomes high in specific gravity and descends to collide the neighborhood of the center of the wafer W which is liable to be overheated, thereby preventing this part from being overheated.

On the other hand, in the case of the wafer temperature being liable to get lower than the temperature necessary for the heat treatment, the coolant supply 294 is ceased in operation or lowered in its output, thereby overcooling is prevented from occurring. Further, the temperature of the thermal surface plate 258 is adjusted as the necessity arises, thereby the temperature affecting the wafer W can be prevented from lowering.

In general, it is known that, when the jacket 290 is operated in a state where the thermal surface plate 258 is maintained at the temperature a little bit higher than the temperature necessary for the heat treatment of the wafer W, the temperature affecting the wafer W is the most suitable temperature for the heat treatment. Accordingly, based on the measured data, the temperatures of the thermal surface plate 258 and the jacket 290 are adjusted to stabilize at these temperatures.

Figure 17:
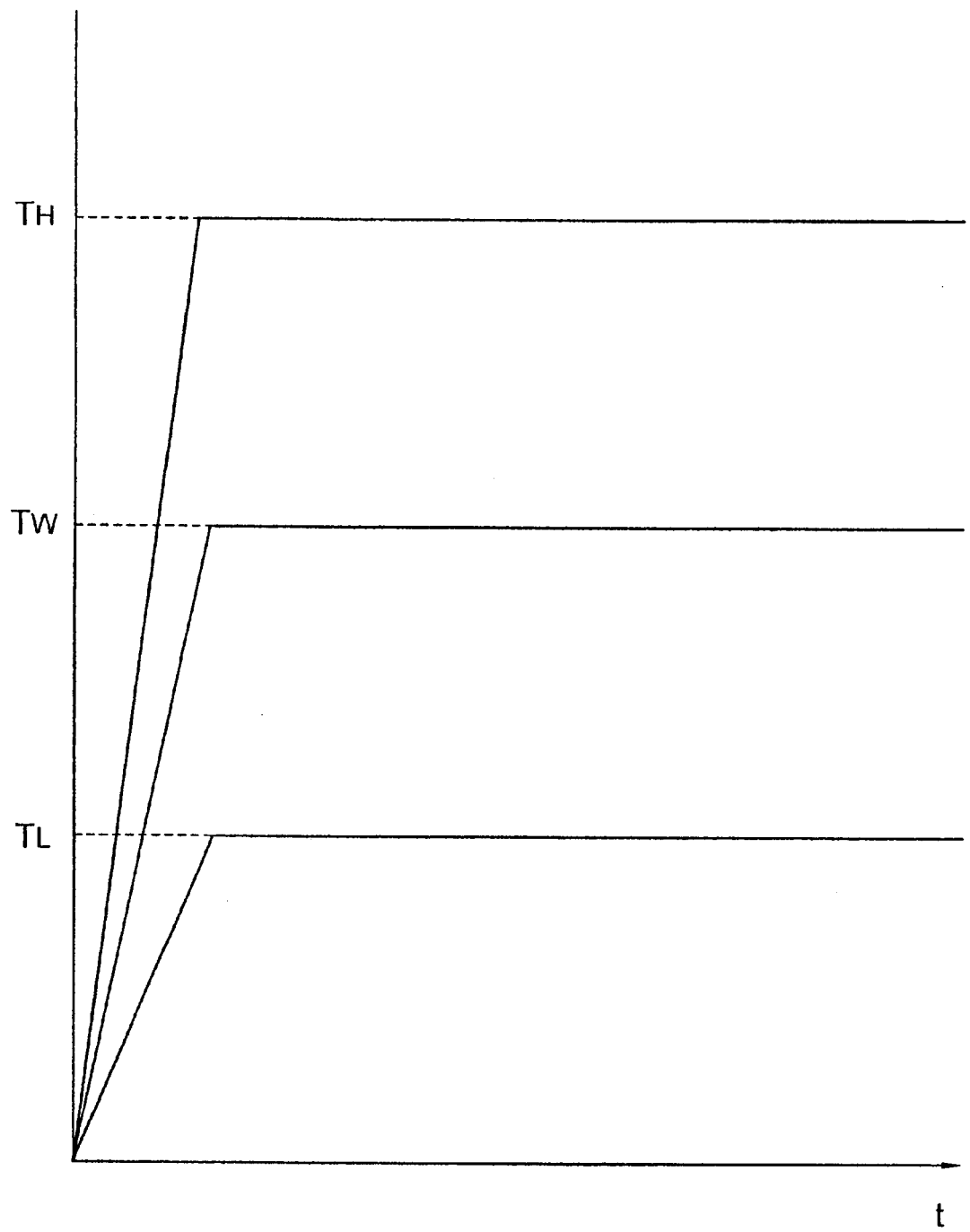
FIG. 17 is a diagram showing relation between the temperature of heat treatment of a heat treatment unit, temperature of wafer W, and temperature of jacket involving the embodiment of the second invention.

More concrete when the aimed value of the temperature of the heat treatment of the wafer W is $T_W$, the temperature of the thermal surface plate 258 is $T_H$, and the temperature (the average temperature) of the jacket 290 is $T_L$, there is a relation of $T_L < T_W < T_H$, between these $T_W$, $T_L$, and $T_H$. In FIG. 17, this relation is depicted.

As shown in FIG. 17, by maintaining the temperature $T_H$ of the heating plate at a constant value and the temperature of the jacket 290 at the predetermined temperature $T_L$ lower than the aimed value $T_W$ of the heat treatment of the wafer W, the temperature affecting the wafer W can be maintained at the value close to the aimed value $T_W$ of the heat treatment. The temperature $T_H$ of the heating plate and the value of the temperature $T_L$ thereto the jacket 290 should be maintained can be obtained based on the measured data.

Further, the temperature $T_L$ thereat the jacket 290 should be maintained may be controlled based on the temperature of the thermal surface plate 258 detected by the temperature sensor (not shown in the figure), or the temperature of the heating medium or the power supplied to the heating medium supplier. Further, based on both temperatures of the wafer W and the thermal surface plate 258, the temperature of the jacket 290 may be controlled.

Incidentally, the present embodiment adopted a jacket 290 incorporating a spiral circulation path 291, however, by using, other than this, a cooler which is formed concentric and has a plurality of cooling portions capable of cooling to the respectively different temperatures by the electric power, or a cooler which has a plurality of sector-shaped cooling portions which are obtained by further dividing the aforementioned concentric cooling portions in the diameter direction, and of which the each part can be cooled independently, a particular effect can be expected.

For instance, in the case of the thermal non-uniformity occurring in the horizontal direction from the center of the thermal surface plate 258 to the periphery portion thereof, by cooling the each sector-shaped cooling portion so as to cancel the thermal non-uniformity on the thermal surface plate 258, the wafer W can be exposed to the uniform heat treatment.

That is, in the case of there being such a temperature gradient that the temperature is low in the neighborhood of the center of the thermal surface plate 258 and rises toward the periphery portion thereof, while cooling strongly the sector-shaped cooling portions on the exterior periphery side, the cooling portions in the neighborhood of the center are cooled weak, the intervening cooling portions therebetween are cooled to the intervening temperature.

On the contrary, in the case of there being such a temperature gradient that the temperature is high in the neighborhood of the center of the thermal surface plate 258 and goes down toward the periphery portion, whereas the cooling portions in the neighborhood of the center of the cover assembly 268 are cooled strong, the cooling portions on the periphery portion is cooled weak, and the intervening cooling potions therebetween are cooled at the intervening temperature. Further, in the case of the temperature being low at both the neighborhood of the center and the periphery portion of the thermal surface plate 258, and the intervening portion between the neighborhood of the center and the periphery portion thereof being high, only the cooling portions positioning immediate above the portion which tends to be high temperature are cooled strong, and the other cooling portions are cooled weak or stopped to cool.

Further, in the case of there occurring some parts of high temperature or low temperature on the thermal surface plate 258, so as to cancel the thermal non-uniformity of that region, some of the cooling portions can be cooled to the different temperatures from the other portions.

Next, the operation will be described for the case of the heat treatment unit being used as a baking unit (PREBAKE) and a cooling unit (COL).

First, from inside the wafer cassette CR set on the stage 20, an wafer W is pulled out by an wafer carrier 21, thereafter the pulled out wafer W is delivered from the wafer carrier 21 to the main wafer carrying mechanism 22. The main wafer carrying mechanism 22 delivers and sets the delivered wafer W into the resist coating unit (COT), where the resist coating is carried out on the wafer W. Next, the main wafer carrying mechanism 22 pulls out the wafer W from inside the resist coating unit (COT), carries the same inside the heat treatment unit and set it on the thermal surface plate 258.

On the other hand, simultaneously with input of power to the heat treatment unit, the heating medium supplier 295 of the thermal surface plate 258 and a circulating system begin to operate, and, after the predetermined time period, the thermal surface plate 258 is maintained at the predetermined temperature, that is, at the temperature a little bit higher than the aimed value of the temperature of the heat treatment of the wafer W. Similarly, also to the cooling medium supplier 294 of the jacket 290 disposed in the central portion of the cover assembly 268, the electric power is inputted to start cooling. Incidentally, in the thermal surface plate 258 involving the present embodiment, there is a tendency that the temperature is high in the vicinity of the center and low in the exterior periphery portion. Accordingly, so as to cancel this, temperature control is carried out so that the heating gas (nitrogen gas) passing through the neighborhood of the center thereof is cooled by the jacket 290 disposed in the neighborhood of the center of the cover assembly 268.

Thus, in the heat treatment unit involving the present embodiment, upon setting the wafer W between the thermal surface plate 258 and cover assembly 268 both of which are controlled in their amount of heat, the gas heated above the temperature of heat treatment of the wafer W by the thermal surface plate 258 tends to linger in the lower side of the vicinity of the center of the cover assembly 268. However, since the cover assembly 268 is provide with the jacket 290 in the center portion, if the temperature of the gas (nitrogen gas) passing through this portion is above the predetermined temperature, the cooling medium is circulated to the jacket 290 to cool the superheated gas passing through the lower side of the jacket 290. The cooled gas collides against the neighborhood of the center of the wafer W and prevents the temperature of this portion from rising. Accordingly, the wafer W which is set therebetween and is exposed to heat treatment is always given uniform amount of heat, thereby the uniform heat treatment is carried out all over the wafer W.

Further, according to the heat treatment unit involving the present embodiment, the temperature control is carried out while detecting the temperatures of the wafer W by sensors, accordingly, a delicate temperature control is possible, thereby the temperature control during heat treatment of the wafer W can be carried out with high accuracy.

Incidentally, the present invention is not restricted to the content of the aforementioned embodiment.

For instance, in the aforementioned embodiment, description was given to a apparatus in which an wafer W is heated by use of a thermal surface plate which is heated uniform by circulating the heating medium inside the same, however, a heating plate which controls the temperature by a temperature sensor or the like by incorporating a nichrome heater inside can be employed.

According to the second invention, whereas the lower surface of the substrate to be treated being heated, the gas heated by a heating means above the predetermined temperature is cooled at the upper portion of the substrate to be treated, accordingly, the gas of high temperature does not tend to linger at the upper portion of the substrate to be treated, thereby, all over the entire substrate to be treated the uniform heat treatment can be carried out.

In the aforementioned apparatus for heat treatment, a means for detecting the temperature affecting the substrate to be treated may be disposed. Based on the temperature detected by the detecting means and affecting the substrate to be treated, the gas passing the upper portion of the substrate to be treated is cooled. Thereby, the temperature control during heat treatment of the substrate can be carried out with high accuracy.

Further, when the gas heated by the heating plate is cooled by the cooler disposed around the exhaust outlet of the cover assembly, the gas of high temperature does not tend to linger in the space between the substrate to be treated and the cover assembly, thereby all over the entire substrate to be treated uniform heat treatment can be carried out.

Around the exhaust outlet of the cover assembly, the sensor for detecting the temperature around there may be disposed. Based on the temperature, detected by the sensor, of the gas in the neighborhood of the exhaust outlet, the heating plate and cooler are controlled. Thereby, the temperature control during the heat treatment of the substrate to be treated can be carried out with high accuracy.

A sensor may be disposed for detecting the temperature of the substrate to be treated. Based on the detected temperature of the substrate to be treated, the heating plate and cooler are controlled. Thereby, the temperature control during the heat treatment of the substrate to be treated can be carried out with high accuracy.

A sensor may be disposed for detecting the temperature of the heating plate. Based on the detected temperature of the heating plate, the heating plate and cooler are controlled. Thereby, the temperature control during the heat treatment of the substrate to be treated can be carried out with high accuracy.

The first sensor for detecting the temperature of the gas around the exhaust outlet and the second sensor for detecting the temperature of the heating plate may be disposed. Based on the temperatures, detected by these sensors, of the gas around the exhaust outlet and the heating plate, the heating plate and cooler are controlled. Thereby, the temperature control during the heat treatment of the substrate to be treated can be carried out with high accuracy.

The first sensor for detecting the temperature of the gas around the exhaust outlet and the second sensor for detecting the temperature of the substrate to be treated may be disposed. Based on the temperatures, detected by these sensors, of the gas around the exhaust outlet and the substrate to be treated, the heating plate and cooler are controlled. Thereby, the temperature control during the heat treatment of the substrate to be treated can be carried out with high accuracy.

The first sensor for detecting the temperature of the gas around the exhaust outlet, the second sensor for detecting the temperature of the substrate to be treated and the third sensor for detecting the temperature of the heating plate may be disposed. Based on the respective temperatures, detected by these sensors, of the gas around the exhaust outlet, the substrate to be treated and the heating plate, the heating plate and cooler are controlled. Thereby, the temperature control during the heat treatment of the substrate to be treated can be carried out with high accuracy.

Example 4

Figure 18:
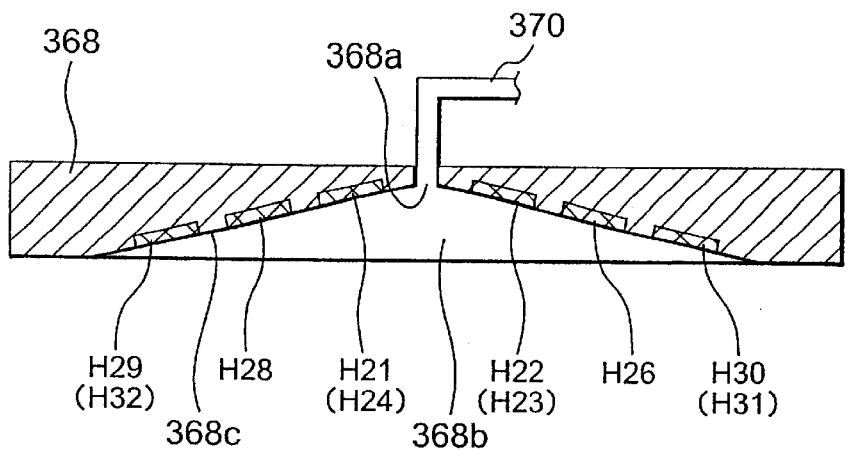
FIG. 18 is a vertical cross section of a cover assembly involving the embodiment of the third invention.
Figure 19:
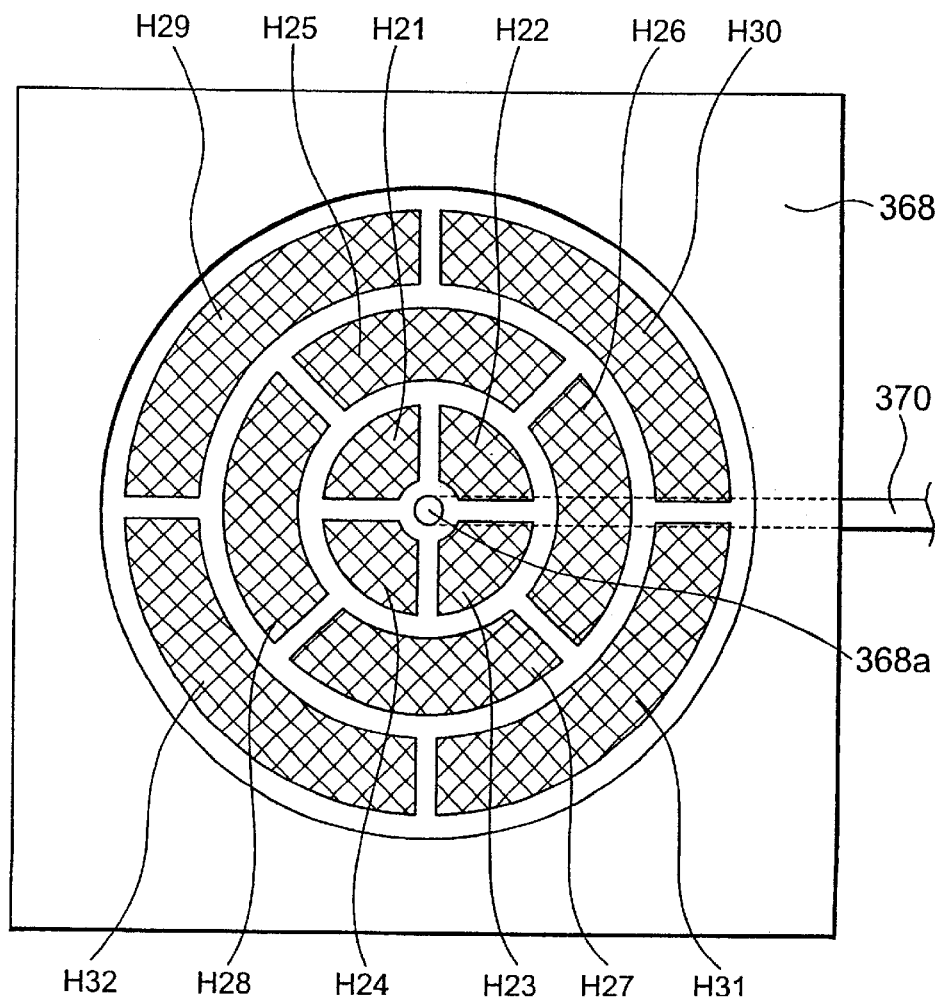
FIG. 19 is a plan view of a state seen from the lower side of a cover assembly and involving the embodiment of the third invention.

FIG. 18 is a vertical cross section of a cover assembly 368 involving the embodiment corresponding to the third invention, and FIG. 19 is a plan view showing a state seen from the bottom side of the cover assembly 368. As shown in FIG. 18, on the lower surface side of the cover assembly 368, a conical concave portion 368*b* is formed, and at a portion corresponding to the top of the cone, an exhaust outlet 368*a* is disposed, to this exhaust outlet 368*a* an lower end of an exhausting pipe 370 is connected. The other end side of the exhausting pipe 370 is connected the not shown exhausting system, the heating gas (air or inert gas such as nitrogen or the like) which ascended heated by the heating plate 358 is collected at the conical concave portion 368b and evacuated through the exhaust outlet 368a and exhausting pipe 370.

On the side wall 368c of the conical concave portion 368b, a plurality of heaters H21 through H32 are disposed forming concentric circles. In the cover assembly 368 involving the present embodiment, twelve sheets of sector type heaters H21 through H32 are disposed, each four sheets of heaters of H21 through H24, heaters H25 through H28, and heaters H29 through H32 are disposed to form three concentric circles different in their diameters, large, medium, and small. These twelve sheets of heaters of H21 through H32 are wired so that electric power is supplied through the respective control unit (not shown in the figure).

Figure 20:
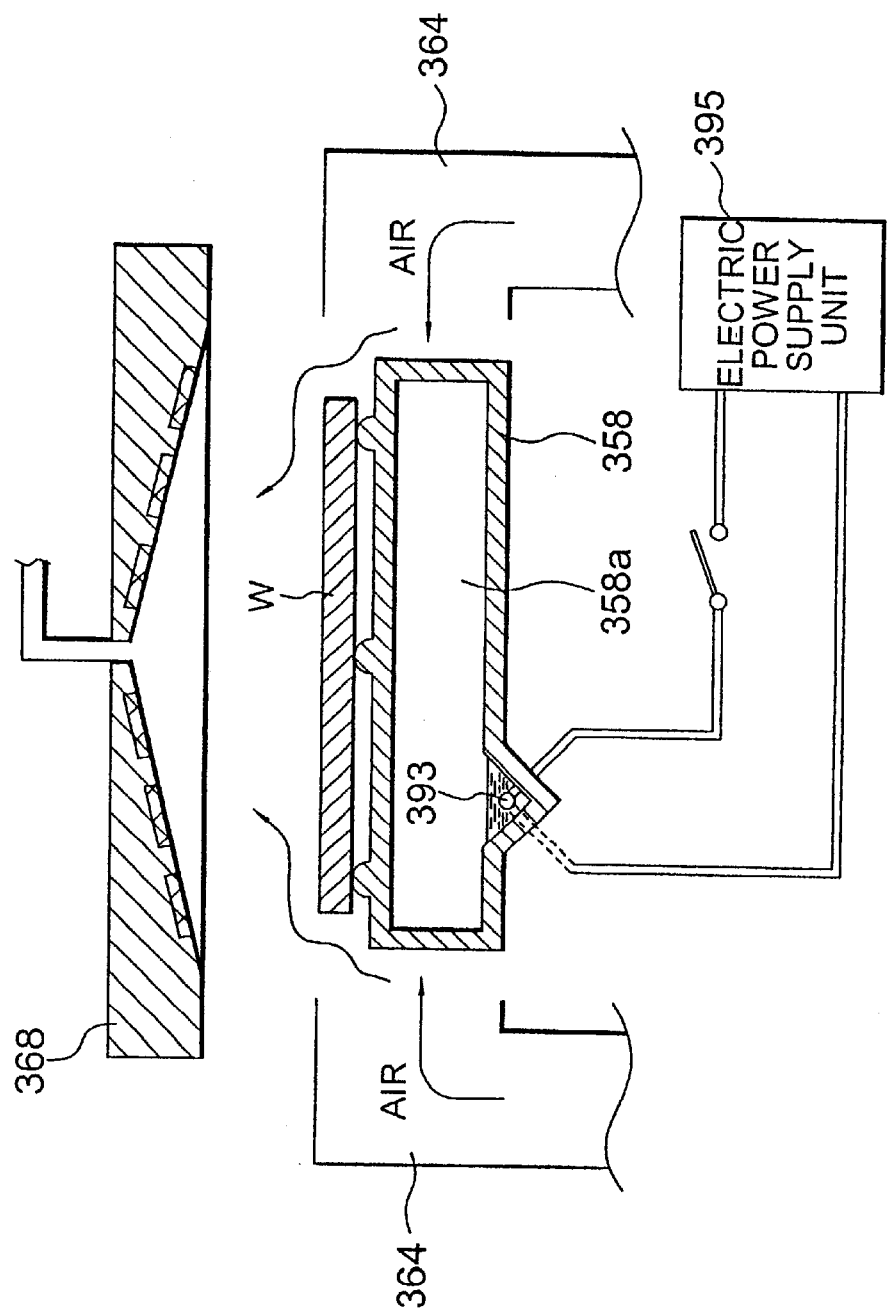
FIG. 20 is a vertical cross section showing schematically a structure of the surroundings of a thermal surface plate involving the embodiment of the third invention.

FIG. 20 is a vertical cross section showing schematically a structure of a thermal surface plate 358 involving the present embodiment and its surroundings. As shown in FIG. 20, the inside of the thermal surface plate 358 is a closed cavity 358a, and on a part of the bottom portion, a heating medium reservoir 358b of which the cross section is formed in a V character shape is disposed. In the heating medium reservoir 358b, a heater such as Nichrome wire or the like 393 is disposed in a direction vertical to the plane of the paper of FIG. 20, to this heater 393, electric power from the power source is supplied controlled by the control unit.

Upon supplying the electric power form the power source 395 to the heater 393 after control by the control unit, the heater 393 starts to evolve heat, thereby the heating medium reserved in the heating medium reservoir 358b due to condensation is heated. The heated heating medium vaporizes and circulates inside the cavity 358a. When the vapor of the heating medium collides against the cold portion in the cavity 358a, the heating medium gives the heat to this cold portion and at the same time condenses to liquefy. At this time, the heating medium heats the entire interior wall of the cavity 358a to a uniform temperature, accordingly the entire thermal surface plate is maintained at a constant temperature.

Figure 21:
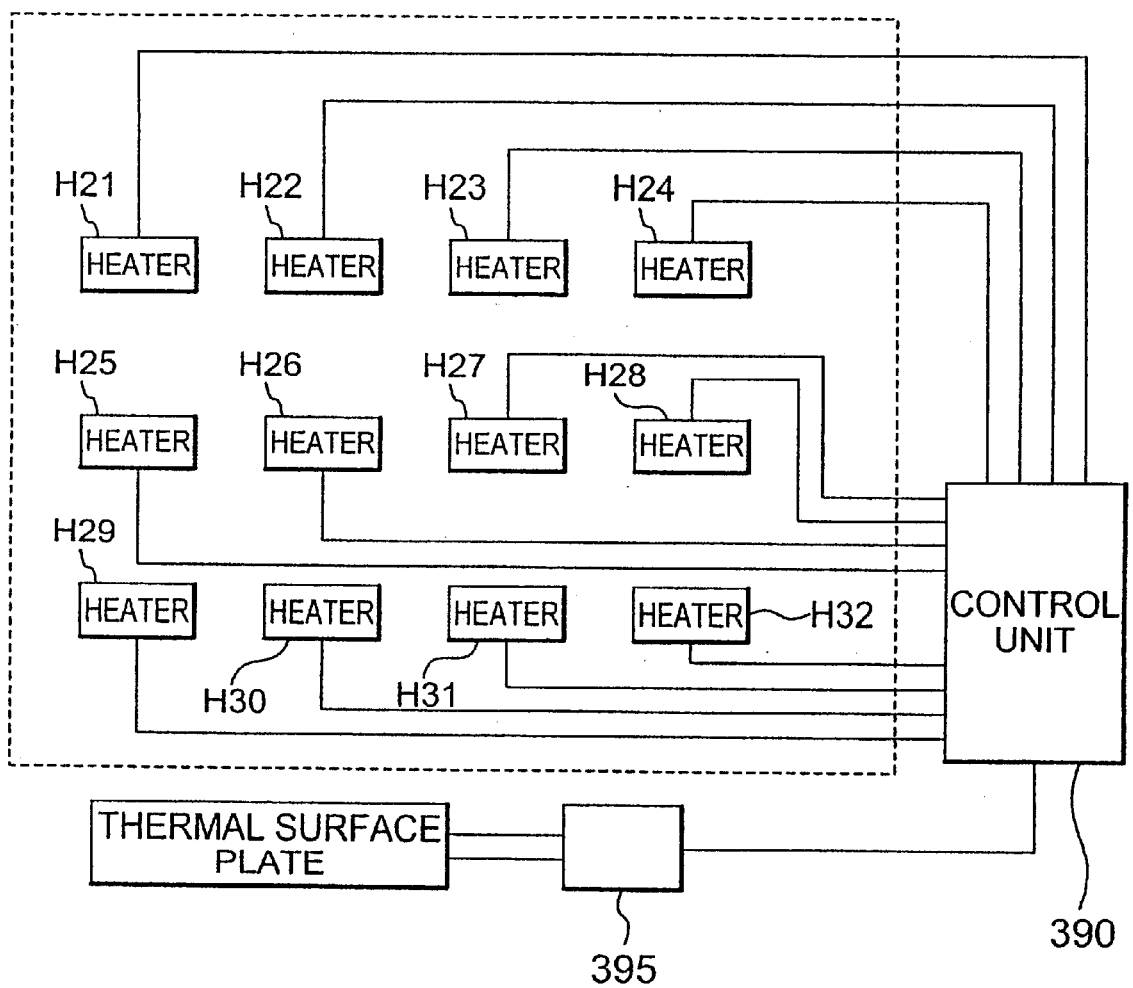
FIG. 21 is a block diagram illustrating a control system of a heat treatment unit involving the embodiment of the third invention.

FIG. 21 is a block diagram illustrating a control system of a heat treatment unit involving the present embodiment. As shown in FIG. 21, to the thermal surface plate 358 an electric power supply 395 for supplying electric power to the heater 393 disposed within the thermal surface plate 358 is connected, the electric power supply 395 is controlled by a control unit 390 and controls the temperature of the thermal surface plate 358. Similarly, twelve sheets of heaters H21 through H32 are also connected to the control unit 390, and turning on/off of these heaters H21 through H32 or the amount of heat of evolution of heaters H21 through H32 can be controlled independently.

Next, the way of control of the heat treatment unit involving the present embodiment will be described.

The thermal surface plate 358 is controlled so as to maintain a constant temperature. The temperature thereto the thermal surface plate 358 is maintained is a temperature convenient for controlling the temperature of heat treatment of the wafer W disposed on the thermal surface plate 358, for instance, a temperature close to the heat treatment temperature of the wafer W and a little bit lower than this heat treatment temperature.

In contrast to the aforementioned thermal surface plate 358 being controlled so as to keep a given temperature, the heaters H21 through H32 are maintained to such temperatures that the temperature to which the thermal surface plate 358 is maintained as well as the heat treatment temperature of the wafer W are maintained constant. For instance, it is a temperature close to the aimed value of the heat treatment temperature of the wafer W and a little bit higher than the aimed value of the temperature of the heat treatment.

In general, the aforementioned temperature of the thermal surface plate is determined based on the aimed value of the heat treatment temperature, and the temperatures of the heaters H21 through H32 are obtained based on the aimed value of the heat treatment temperature of the wafer W and the temperature of the thermal surface plate.

That is, in the case of the temperature of the thermal surface plate 358 being maintained at a little bit lower temperature with respect to the aimed value of the heat treatment temperature and the wafer W being heated from the upper surface in this state, the temperature where the temperature actually affecting the wafer W becomes the closest to the aimed value is obtained, to these temperatures, the temperatures of the heaters H21 through H32 are controlled.

Figure 22:
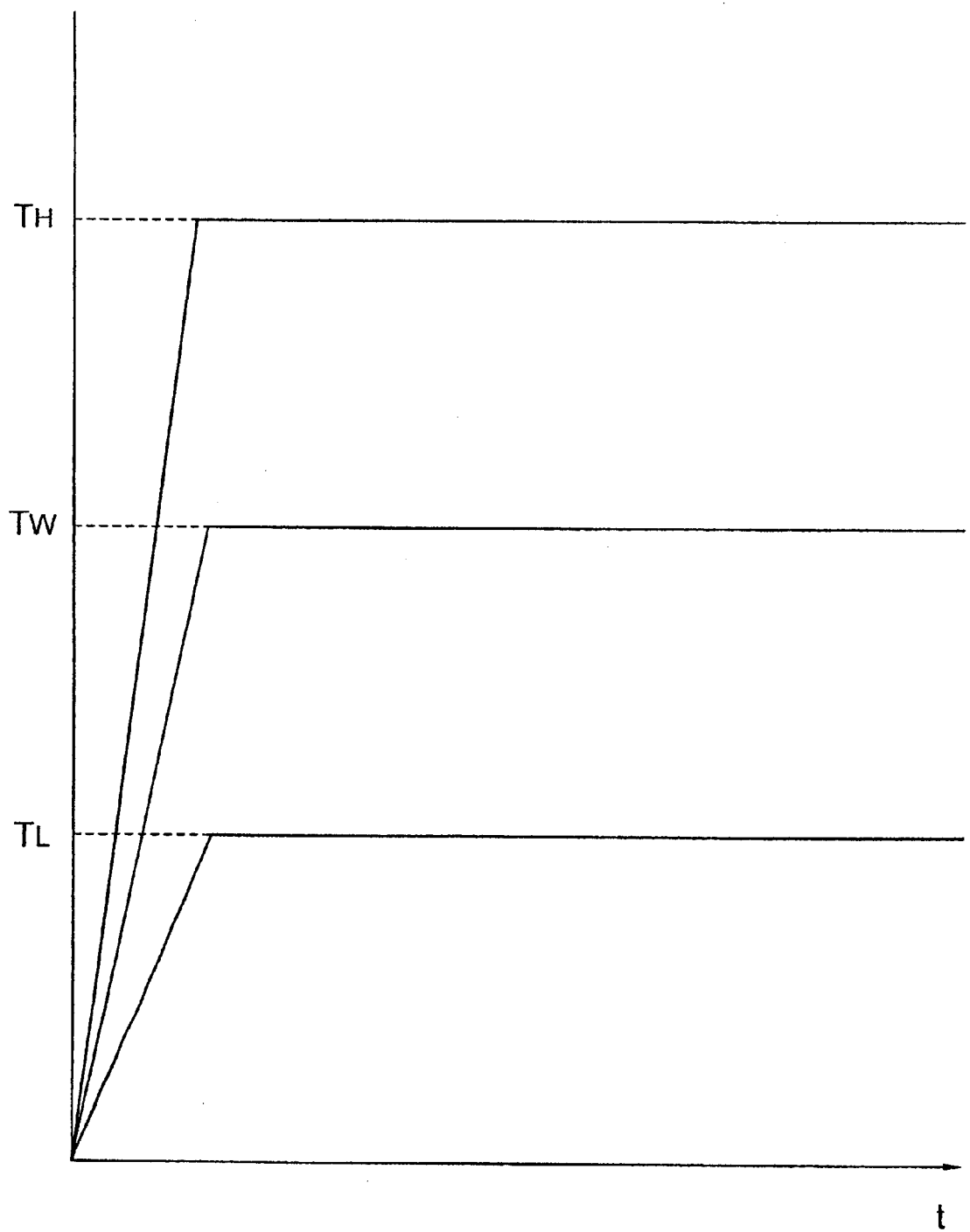
FIG. 22 is a diagram showing relation between temperature of heat treatment of the heat treatment unit, temperature of wafer W, and temperature of heater involving the embodiment of the third invention.

In the more concrete, when the aimed value of the temperature of the heat treatment of the wafer W is $T_W$, the temperature of the thermal surface plate 358 is $T_L$, and the temperature (the average temperature) of the heaters H21 though H32 is $T_H$, there is a relation of $T_L < T_W < T_H$ between these $T_W$, $T_L$, and $T_H$. In FIG. 22, this relation is depicted.

As shown in FIG. 22, by maintaining the temperature $T_L$ of the heating plate at a constant value and the temperature of the heaters H21 through H32 at the predetermined temperature $T_H$ higher than the aimed value $T_W$ of the temperature of the heat treatment of the wafer W, the temperature affecting the wafer W can be maintained at the value close to the aimed value $T_W$ of the temperature of the heat treatment. The temperature $T_L$ of the heating plate and the value of the temperature $T_H$ thereto the heaters H21 through H32 should be maintained can be obtained based on the measured data.

Incidentally, the temperature $T_H$ thereto the heaters H21 through H32 should be maintained may be controlled based on the temperature of the wafer W detected by the temperature sensor (not shown in the figure).

Further, in the case of the thermal non-uniformity occurring in the horizontal direction from the central portion of the thermal surface plate 358 toward the periphery thereof, by heating the heaters H21 through H32 so that the thermal non-uniformity on the thermal surface plate 358 is cancelled, the wafer W can be exposed to the uniform heat treatment.

For instance, in the case of there being such a temperature gradient that the temperature is low in the neighborhood of the center of the thermal surface plate 358 and rises towards the periphery portion, while heating the heaters H21 through H32 of the center of the cover assembly 368 to high temperature, the heaters H29 through H32 of the exterior periphery are heated at low temperature, and intervening heaters H25 through H28 are maintained at the intervening temperature.

On the contrary, in the case of there being such a temperature gradient that the temperature is high in the neighborhood of the center of the thermal surface plate 358 and goes down towards the periphery portion thereof, while the heaters H21 through H24 in the center of the cover assembly 368 are heated at low temperature, the heaters H29 through H32 of the exterior periphery portion are heated to high temperature, and the intervening heaters H25 through H28 are maintained at the intervening temperature. Further, in the case of the temperature being low in the neighborhood of the center of the thermal surface plate 358 and the periphery thereof and being high in the intervening portion, the heaters H21 through H24 and heaters H29 through H32 are heated to high temperature and the heaters H25 through H28 are heated to the low temperature. In the case of there occurring partly high temperature or low temperature portions due to the characteristic of the thermal surface plate 358, so as to cancel the non-uniformity, some of the heaters H21 through H32 can be heated to the temperatures different form the other heaters.

Further, in the present embodiment, the twelve sheets of heaters H21 through H32 which are divided into sector-shape as shown in FIG. 19 are employed, however, a so-called gradation heater which is a sheet of continuous heater and can vary local heating or heating amount for each local portion can be employed. In that case, while being a sheet of continuous heater, it can heat locally as mentioned above. Accordingly, while maintaining the aforementioned characteristics, the number of component can be reduced or the manufacturing process can be simplified, resulting in the reduction of the manufacturing cost.

Next, the operation in the case of this heat treatment unit being employed as a baking unit (PREBAKE) and a cooling unit (COL) will be described in the following.

First, from inside the wafer cassette CR set on the stage 20, an wafer W is pulled out by an wafer carrier 21, thereafter the pulled out wafer W is delivered from the wafer carrier 21 to the main wafer carrying mechanism 22. The main wafer carrying mechanism 22 delivers and sets the delivered wafer W into the resist coating unit (COT), where the resist coating is carried out on the wafer W. Next, the main wafer carrying mechanism 22 pulls out the wafer W from inside the resist coating unit (COT), carries the same into the heat treatment unit and set the wafer W on the thermal surface plate 358.

On the other hand, simultaneously with input of power to the heat treatment unit, the electric power supply 395 of the thermal surface plate 358 begins to operate, and, after the predetermined time period, the thermal surface plate 358 is maintained at the predetermined temperature, that is, at the temperature a little bit lower than the aimed value of the temperature of the heat treatment of the wafer W. Similarly, also to the heaters H21 through H32 disposed on the lower surface side of the cover assembly 368, the electric power is inputted to start heating. Incidentally, in the thermal surface plate 358 involving the present embodiment, there is a tendency that the temperature is high in the vicinity of the center and low in the exterior periphery portion. Accordingly, in order to cancel this, temperature control is carried out so that the heating temperatures at the heaters H21 through h24 of the cover assembly 368 are low, and as the heaters go to the heaters H25 through H28 on the outside than these and heaters H29 through H32 of further outside, the heating temperature gradually goes up.

Thus, in the heat treatment unit involving the present embodiment, upon setting the wafer W between the thermal surface plate 358 and cover assembly 368 both of which are controlled in their amount of heat, since the amount of heat of the heaters H21 through H32 of the cover assembly 368 is controlled so as to cancel the thermal non-uniformity of the amount of heat from the thermal surface plate 358, accordingly, the wafer W which is set therebetween and is exposed to heat treatment is always given uniform amount of heat, thereby the uniform heat treatment is carried out all over the wafer W.

Further, since the temperatures of heaters H21 through H32 are controlled to be high with respect to the temperature of the thermal surface plate 358, the thermal gradient is constituted to get high always from the lower side toward the upper side in the vertical direction. Therefore, the gas heated by the thermal surface plate 358 ascends straight up, and there does not occur thermal convection in the space formed between the thermal surface plate 358 and the heaters H21 and H32.

Therefore, the non-uniform supply of amount of heat induced by this thermal convection can be prevented from occurring, thereby uniform heat treatment of the wafer W is made possible.

Further, according to the heat treatment unit involving the present embodiment, whereas the wafer W is heated from the lower surface side while maintaining the thermal surface plate 358 at a relatively low temperature close to the lower limit for the heat treatment, the necessary amount of heat is supplied additionally from the upper surface side of the wafer W by the heaters H21 through H32. Therefore, the delicate temperature control is made, moreover, there is no possibility of occurrence of convection due to the change of the amount of heat of the heaters H21 through H32. Thus, the temperature control during the heat treatment can be carried out with high accuracy.

Incidentally, the present invention is not restricted to the contents of the aforementioned embodiment.

For instance, in the aforementioned embodiment, the cover assembly has a shape in which the lower surface of the cover assembly is cut in a cone, however, the shape of the lower surface can be formed in a level surface. In the case of the cover assembly having the lower surface of the level plane, there are such advantages that manufacture of the cover assembly is simple and the entire heat treatment unit can be made compact due to the smaller cover assembly. Incidentally, in the case of the lower surface of the cover assembly being a level plane, by adequately combining the shape, arrangement, and capacity of evolution of heat of the heaters H21 through H32, the thermal convection is prevented from occurring between the thermal surface plate 358 and the heaters H21 through H32.

Further, in the aforementioned embodiment, the heaters H21 through 32 are disposed concentric, other than this, various arrangement such as spiral disposition can be adopted.

Similarly, in the aforementioned embodiment, the wafer W is heated by use of the thermal surface plate which is heated uniformly by circulating the heating medium inside, instead, a heating plate which incorporates nichrome heater therein and controls the temperature by the temperature sensor can be employed.

According to the third invention, while the lower surface of the substrate to be treated is heated to the predetermined temperature by the first heating means, the upper surface of the substrate to be treated is heated to the temperature higher than that obtained by the first heating means by the second heating means, thereby such the temperature gradient is formed in the space where the heat treatment is given to the substrate to be treated that the temperature rises from below toward above. Thus, there does not occur the thermal convection which makes irregular the flow of the heating gas and the uniform heat treatment can be carried out all over the substrate to be treated.

When the temperature of heat treatment of the substrate to be treated is adjusted by controlling the second heating means which heats the upper surface of the substrate to be treated, the flow of the heating gas is not disturbed, thus the temperature control during the heat treatment of the substrate to be treated can be carried out with high accuracy.

When the second heating means is controlled so that the temperature of heat treatment of the substrate to be treated becomes the aimed temperature by further use of the aforementioned means for detecting the temperature of the substrate to be treated, based on the actually detected temperature of the substrate to be treated, the temperature control during the heat treatment of the substrate to be treated can be carried out with high accuracy.

While heating the lower surface of the substrate to be treated to the predetermined temperature by use of the heating plate, the upper surface of the substrate to be treated is heated to the temperature higher than the heating plate by use of the heaters. Thus, in the space where the heat treatment is carried out to the substrate to be treated, such a temperature gradient is formed that the temperature rises from below toward above. Thereby, the thermal convection which makes irregular the flow of the heating gas does not occur in this space, the uniform heat treatment can be carried out all over the substrate to be treated. Further, when the heaters are adjusted by the second control portion to the temperature where the substrate to be treated is treated at the aimed temperature, the flow of the heating gas is not disturbed, resulting in the highly accurate temperature control during the heat treatment of the substrate to be treated.

In the aforementioned apparatus of heat treatment, if such a heater is adopted that is divided into a plurality of heaters capable of turning on and off the electric power source independently, a delicate temperature control can be carried out, resulting in the further highly accurate temperature control during the heat treatment of the substrate to be treated.

What is claimed is:

1. A heat treatment apparatus, which comprises:
   a heating means for heating a lower surface of a substrate to be treated;
   a means for evacuating a gas heated by the heating means from an upper portion of the substrate to be treated;
   a means for detecting a temperature affecting the substrate to be treated; and
   a means for cooling, based on the detected temperature, a gas passing through the above portion of the substrate to be treated;
   wherein the heating means is a heating plate and which comprises further a cover assembly disposed above the heating plate and collecting a gas heated by the heating plate; the evacuating means is an exhausting system connected to an exhaust outlet at a center of the cover assembly; and the cooling means comprises a cooler disposed in the neighborhood of the exhaust outlet of the cover assembly and a control unit for controlling the heating plate and the cooler so that heat affects uniformly on the substrate to be treated.

2. The heat treatment apparatus as set forth in claim 1:
   wherein the cooler is disposed in spiral.

3. The heat treatment apparatus as set forth in claim 1:
   wherein the cooler is composed of a plurality of doughnut shaped coolers disposed concentric.

4. The heat treatment apparatus as set forth in claim 1:
   wherein the cooler is a sector-shaped cooler formed in a plurality of concentric circles.

5. The heat treatment apparatus as set forth in claim 1:
   wherein the heating plate is a thermal sur face plate of which temperature is maintained to a predetermined temperature by a heating medium vapor circulating therein.

6. A heat treatment apparatus, which comprises:
   a heating means for heating a lower surface of a substrate to be treated;
   a means for evacuating a gas heated by the heating means from an upper portion of the substrate to be treated;
   a means for detecting a temperature affecting the substrate to be treated; and
   a means for cooling, based on the detected temperature, a gas passing through the above portion of the substrate to be treated;
   wherein the heating means is a heating plate and which comprises further a cover assembly disposed above the heating plate and collecting a gas heated by the heating plate; the evacuating means is an exhausting system connected to an exhaust outlet at a center of the cover assembly; and the cooling means comprises a cooler disposed in the neighborhood of the exhaust outlet of the cover assembly, a sensor for detecting temperature of a gas in the neighborhood of the exhaust outlet, and a control unit for controlling the heating plate and the cooler based on the detected temperature.

7. The heat treatment apparatus as set forth in claim 6:
   wherein the heating means is a heating plate and which comprises further a cover assembly disposed above the heating plate and collecting a gas heated by the heating plate; the evacuating means is an exhausting system connected to an exhaust outlet at a center of the cover assembly; and the cooling means comprises a cooler disposed in the neighborhood of the exhaust outlet of the cover assembly, a first sensor detecting a temperature of a gas in the neighborhood of the exhaust outlet, a second sensor detecting a temperature of the heating plate, and a control unit for controlling the heating plate and the cooler based on the detected temperatures of the gas and heating plate.

8. The heat treatment apparatus as set forth in claim 6:
   wherein the heating means is a heating plate and which comprises further a cover assembly disposed above the heating plate and collecting a gas heated by the heating plate; the evacuating means is an exhausting system connected to an exhaust outlet at a center of the cover assembly; and the cooling means comprises a cooler disposed in the neighborhood of the exhaust outlet of the cover assembly, a first sensor detecting a temperature of a gas in the neighborhood of the exhaust outlet, a second sensor detecting a temperature of the substrate to be treated, and a control unit for controlling the heating plate, and the cooler based on the detected temperatures of the gas and substrate to be treated.

9. A heat treatment apparatus, which comprises:
   a heating means for heating a lower surface of a substrate to be treated;
   a means for evacuating a gas heated by the heating means from an upper portion of the substrate to be treated;
   a means for evacuating a gas heated by the heating means from an upper portion of the substrate to be treated;
   a means for detecting a temperature affecting the substrate to be treated; and
   a means for cooling, based on the detected temperature, a gas passing through the above portion of the substrate to be treated;
   wherein the heating means is a heating plate and which comprises further a cover assembly disposed above the heating plate and collecting a gas heated by the heating plate; the evacuating means is an exhausting system connected to an exhaust outlet at a center of the cover assembly; and the cooling means comprises a cooler disposed in the neighborhood of the exhaust outlet of the cover assembly, a sensor detecting a temperature of the substrate to be treated, and a control unit for controlling the heating plate and the cooler based on the detected temperature.

10. The heat treatment apparatus as set forth in claim 9:
wherein the heating means is a heating plate and which comprises further a cover assembly disposed above the heating plate and collecting a gas heated by the heating plate; the evacuating means is an exhausting system connected to an exhaust outlet at a center of the cover assembly; and the cooling means comprises a cooler disposed in the neighborhood of the exhaust outlet of the cover assembly, a first sensor detecting a temperature of a gas in the neighborhood of the exhaust outlet, a second sensor detecting a temperature of the heating plate, and a control unit for controlling the heating plate, and a control unit for controlling the heating plate and the cooler based on the detected temperatures of the gas and heating plate.

11. A heat treatment apparatus, which comprises:
a heating means for heating a lower surface of a substrate to be treated;
a means for evacuating a gas heated by the heating means from an upper portion of the substrate to be treated;
a means for detecting a temperature affecting the substrate to be treated; and a means for cooling, based on the detected temperature, a gas passing through the above portion of the substrate to be treated;
wherein the heating means is a heating plate and which comprises further a cover assembly disposed above the heating plate and collecting a gas heated by the heating plate; the evacuating means is an exhausting system connected to an exhaust outlet at a center of the cover assembly; and the cooling means comprises a cooler disposed in the neighborhood of the exhaust outlet at the center of the cover assembly, a sensor detecting a temperature of the heating plate, and a control unit for controlling the heating plate and the cooler based on the detected temperature.

* * * * *

UNITED STATES PATENT AND TRADEMARK OFFICE
CERTIFICATE OF CORRECTION

PATENT NO.    : 6,450,803 B2
DATED         : September 17, 2002
INVENTOR(S)   : Shirakawa et al.

It is certified that error appears in the above-identified patent and that said Letters Patent is hereby corrected as shown below:

Title page,
Item [62], Related U.S. Application Data, should read:

-- Division of application no. 09/226,606, filed on Jan. 7, 1999 now Pat. No. 6,222,161. --

Column 24,
Line 49, delete "," immediately after the word "plate".

Column 25,
Line 20, delete ", and a control unit for controlling the heating plate".

Signed and Sealed this

Seventeenth Day of June, 2003

JAMES E. ROGAN
*Director of the United States Patent and Trademark Office*